(12) United States Patent
Gutala et al.

(10) Patent No.: US 11,632,112 B2
(45) Date of Patent: Apr. 18, 2023

(54) INTEGRATED CIRCUIT DEVICE WITH SEPARATE DIE FOR PROGRAMMABLE FABRIC AND PROGRAMMABLE FABRIC SUPPORT CIRCUITRY

(71) Applicant: Intel Corporation, Santa Clara, CA (US)

(72) Inventors: Ravi Prakash Gutala, San Jose, CA (US); Aravind Raghavendra Dasu, Milpitas, CA (US); Sean R. Atsatt, Santa Cruz, CA (US); Scott J. Weber, Piedmont, CA (US)

(73) Assignee: Intel Corporation, Santa Clara, CA (US)

( * ) Notice: Subject to any disclaimer, the term of this patent is extended or adjusted under 35 U.S.C. 154(b) by 1244 days.

(21) Appl. No.: 15/855,419

(22) Filed: Dec. 27, 2017

(65) Prior Publication Data
US 2019/0044515 A1 Feb. 7, 2019

(51) Int. Cl.
*G06F 7/38* (2006.01)
*H03K 19/173* (2006.01)
(Continued)

(52) U.S. Cl.
CPC ... *H03K 19/017581* (2013.01); *G06F 3/0604* (2013.01); *G06F 3/0632* (2013.01);
(Continued)

(58) Field of Classification Search
CPC ... H01L 2224/16227; H01L 2224/1703; H01L 2224/8112; H01L 2224/16225; H01L 2224/16145; H01L 2224/17181; H01L 2225/06589; H01L 2225/06513; H01L 2225/06517; H01L 2225/06541; H01L 2924/14335; H01L 2924/1431; H01L 2924/1435; H01L 2924/1433; H01L 2924/1432; H01L 2924/00014; H01L 2924/15311; H01L 23/481; H01L 23/5381; H01L 23/5386; H01L 23/3675; H01L 23/5385; H01L 23/367; H01L 23/473;
(Continued)

(56) References Cited

U.S. PATENT DOCUMENTS 6,549,239 B1 * 4/2003 Tao ............... H04N 5/2354
348/370
7,701,252 B1 4/2010 Chow et al.
(Continued)

FOREIGN PATENT DOCUMENTS

EP 3002877 A1 4/2016

OTHER PUBLICATIONS

Extended European Search Report for EP Application No. 18208736.1 dated May 13, 2019.

*Primary Examiner* — Ismail A Muse
(74) *Attorney, Agent, or Firm* — Fletcher Yoder P.C.

(57) ABSTRACT

An integrated circuit device having separate dies for programmable logic fabric and circuitry to operate the programmable logic fabric are provided. A first integrated circuit die may include field programmable gate array fabric. A second integrated circuit die may be coupled to the first integrated circuit die. The second integrated circuit die may include fabric support circuitry that operates the field programmable gate array fabric of the first integrated circuit die.

24 Claims, 24 Drawing Sheets

(51) Int. Cl.
| | |
|---|---|
| *H03K 19/0175* | (2006.01) |
| *G06F 3/06* | (2006.01) |
| *G11C 11/417* | (2006.01) |
| *H01L 25/18* | (2023.01) |
| *H01L 27/02* | (2006.01) |
| *H01L 23/48* | (2006.01) |
| *H01L 23/538* | (2006.01) |
| *H01L 23/00* | (2006.01) |
| *H01L 25/00* | (2006.01) |
| *H01L 23/367* | (2006.01) |
| *G11C 7/10* | (2006.01) |
| *H03K 19/17796* | (2020.01) |
| *G11C 5/04* | (2006.01) |
| *G06F 30/34* | (2020.01) |

(52) U.S. Cl.
CPC ............. *G06F 3/0679* (2013.01); *G11C 7/10* (2013.01); *G11C 11/417* (2013.01); *H01L 23/3675* (2013.01); *H01L 23/481* (2013.01); *H01L 23/5381* (2013.01); *H01L 23/5385* (2013.01); *H01L 23/5386* (2013.01); *H01L 24/17* (2013.01); *H01L 24/81* (2013.01); *H01L 25/18* (2013.01); *H01L 25/50* (2013.01); *H01L 27/0207* (2013.01); *H03K 19/17796* (2013.01); *G06F 30/34* (2020.01); *G11C 5/04* (2013.01); *H01L 23/367* (2013.01); *H01L 2224/16145* (2013.01); *H01L 2224/16225* (2013.01); *H01L 2224/16227* (2013.01); *H01L 2224/1703* (2013.01); *H01L 2224/17181* (2013.01); *H01L 2224/8112* (2013.01); *H01L 2924/1431* (2013.01); *H01L 2924/1432* (2013.01); *H01L 2924/1433* (2013.01); *H01L 2924/1435* (2013.01); *H01L 2924/14335* (2013.01)

(58) Field of Classification Search
CPC ......... H01L 24/17; H01L 24/81; H01L 25/18; H01L 25/50; H01L 25/0652; H01L 27/0207; H03K 19/017581; H03K 19/17796; G06F 3/0632; G06F 3/0679; G06F 3/0604; G06F 30/34; G11C 11/417; G11C 5/04; G11C 7/10
USPC .......................................................... 326/37
See application file for complete search history.

(56) References Cited

U.S. PATENT DOCUMENTS

| | | | |
|---|---|---|---|
| 8,179,159 B1 * | 5/2012 | Trimberger | H03K 19/17736 326/38 |
| 8,546,955 B1 | 10/2013 | Wu | |
| 8,922,244 B2 | 12/2014 | Chi | |
| 2009/0070727 A1 * | 3/2009 | Solomon | H01L 21/8221 716/128 |
| 2010/0123477 A1 * | 5/2010 | Sun | H01L 25/18 326/41 |
| 2014/0049932 A1 * | 2/2014 | Camarota | G01R 31/28 361/807 |
| 2014/0062545 A1 * | 3/2014 | Dai | H03M 1/0818 327/142 |
| 2014/0175666 A1 * | 6/2014 | Rahman | H01L 23/5384 257/774 |
| 2015/0116001 A1 * | 4/2015 | Rahman | G11C 8/00 326/39 |
| 2016/0316562 A1 * | 10/2016 | Mundt | G06F 1/185 |
| 2017/0179389 A1 * | 6/2017 | Cho | H01L 51/001 |
| 2017/0271232 A1 * | 9/2017 | Colgan | H01L 21/563 |
| 2017/0364469 A1 * | 12/2017 | Crisp | H01L 24/92 |
| 2020/0227389 A1 * | 7/2020 | Teig | H01L 24/92 |

* cited by examiner

INTEGRATED CIRCUIT DEVICE WITH SEPARATE DIE FOR PROGRAMMABLE FABRIC AND PROGRAMMABLE FABRIC SUPPORT CIRCUITRY

BACKGROUND

This disclosure relates to an integrated circuit that includes a first die containing programmable logic fabric and a second die containing support circuitry for operating the programmable logic fabric.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. The values programmed into the CRAM cells define the operation of programmable logic elements of the programmable logic device.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. Moreover, bitstreams that define a particular accelerator function may be programmed into a programmable logic device as requested, in a process known as partial reconfiguration. Even this, however, takes some amount of time to perform. Although partial reconfiguration may take place very quickly, on the order of milliseconds, some tasks may call for even quicker calculations, on the order of microseconds or faster.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
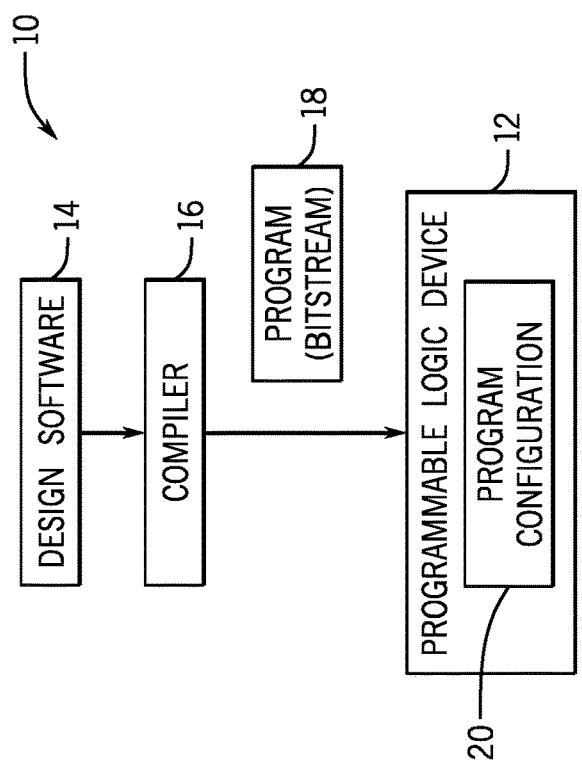
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. Moreover, bitstreams that define a particular accelerator function may be programmed into a programmable logic device as requested, in a process known as partial reconfiguration.

To increase the speed at which configuration, including partial reconfiguration, can occur on a programmable logic device, as well as to better control power consumption, reduce manufacturing costs, among other things, this disclosure describes systems and methods that employ a programmable logic device composed of at least two separate die. The programmable logic device may include a first die that contains primarily programmable logic fabric, and a second die that contains fabric support circuitry to support the operation of the programmable logic fabric. Indeed, the second die may contain at least some fabric support circuitry that may operate the programmable logic fabric (e.g., the fabric support circuitry of the second die may be essential to the operation of the programmable logic fabric of the first die). Thus, the fabric support circuitry may include, among other things, a device controller (sometimes referred to as a secure device manager (SDM)), a sector controller (sometimes referred to as a local sector manager (LSM)), a network-on-chip (NOC), a configuration network on chip (CNOC), data routing circuitry, local (e.g., sectorized or sector-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die. Indeed, in some embodiments, the first die may entirely or almost entirely contain programmable logic fabric, and the second die may contain all or almost all of the fabric support circuitry that controls the programmable logic fabric.

By separating at least some of the programmable logic fabric and at least some of the fabric support circuitry, the programmable logic fabric may be programmed or operated more quickly or efficiently. Indeed, the first die that contains the programmable logic fabric may not contain as much fabric support circuitry as a single die that would contain both the programmable logic fabric and the fabric support circuitry. This may allow the first die to be more dense with programmable logic fabric. Moreover, in some cases, the first die and the second die may be vertically stacked and connected to one another via an efficient connection, such as via microbumps, which may allow a parallel connection between the programmable logic fabric and the fabric support circuitry, further increasing a speed of configuring and/or operating the programmable logic fabric. In addition, in some cases, a configuration program (e.g., bitstream) may be cached into sector-aligned memory in the fabric support circuitry of the second die. This may allow for rapid partial reconfiguration by configuring the programmable logic fabric using a cached configuration. Data may also be cached or stored in greater amounts for use by the programmable logic fabric.

With this in mind, FIG. 1 illustrates a block diagram of a system 10 that may employ a reconfigurable programmable logic device 12 that has separate die for programmable logic fabric and fabric support circuitry. A designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design program (bitstream) 18, sometimes known as a program object file and/or configuration program, that programs the programmable logic device 12. Thus, the compiler 16 may provide machine-readable instructions representative of the circuit design to the programmable logic device 12. For example, the programmable logic device 12 may receive one or more programs (bitstreams) 18 that describe the hardware implementations that should be stored in the programmable logic device 12. A program (bitstream) 18 may be programmed into the programmable logic device 12 as a configuration program 20. The configuration program may, in some cases, represent an accelerator function to perform for machine learning, video processing, voice recognition, image recognition, or other highly specialized task.

Figure 2:
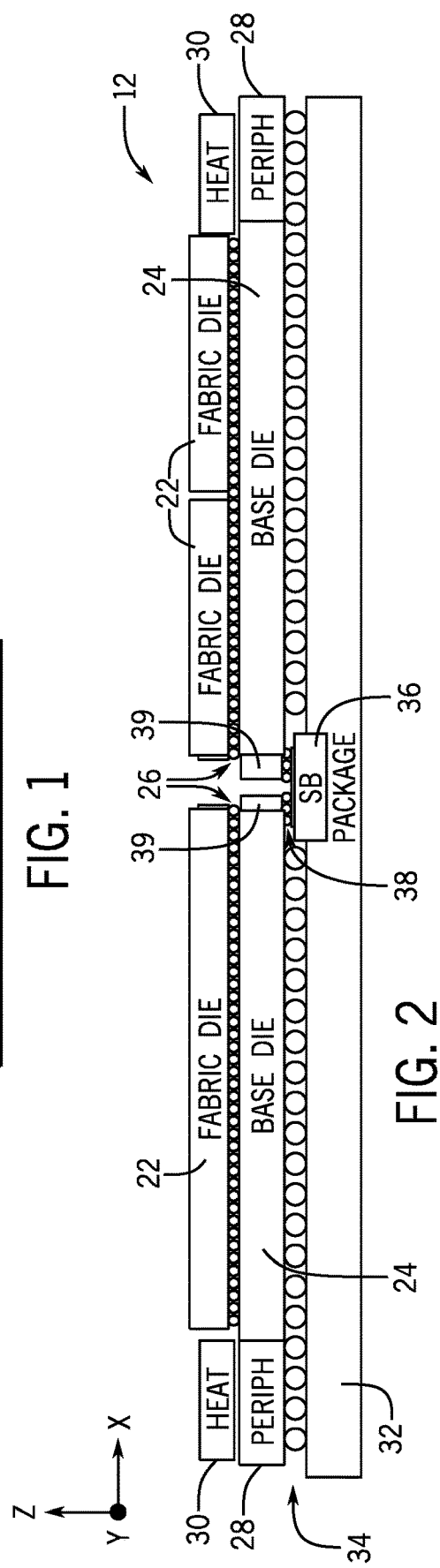
FIG. 2 is a block diagram of a package including the programmable logic device where a fabric die is vertically stacked with a base die, in accordance with an embodiment.

The programmable logic device 12 may represent any integrated circuit device that includes a programmable logic device with two separate integrated circuit die where at least some of the programmable logic fabric is separated from at least some of the fabric support circuitry that operates the programmable logic fabric. One example of the programmable logic device 12 is shown in FIG. 2, but many others are described further below, and it should be understood that this disclosure is intended to encompass any suitable programmable logic device 12 where programmable logic fabric and fabric support circuitry are at least partially separated on different integrated circuit die. Indeed, in the example of FIG. 2, the programmable logic device 12 includes a fabric die 22 and a base die 24 that are connected to one another via microbumps 26. Although the fabric die 22 and base die 24 appear in a one-to-one relationship or a two-to-one relationship in FIG. 2, other relationships may be used. For example, a single base die 24 may attach to several fabric die 22, or several base die 24 may attach to a single fabric die 22, or several base die 24 may attach to several fabric die 22 (e.g., in an interleaved pattern along the x- and/or y-direction). Peripheral circuitry 28 may be attached to, embedded within, and/or disposed on top of the base die 24, and heat spreaders 30 may be used to reduce an accumulation of heat on the programmable logic device 12. The heat spreaders 30 may appear above, as pictured, and/or below the package (e.g., as a double-sided heat sink). The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Figure 3:
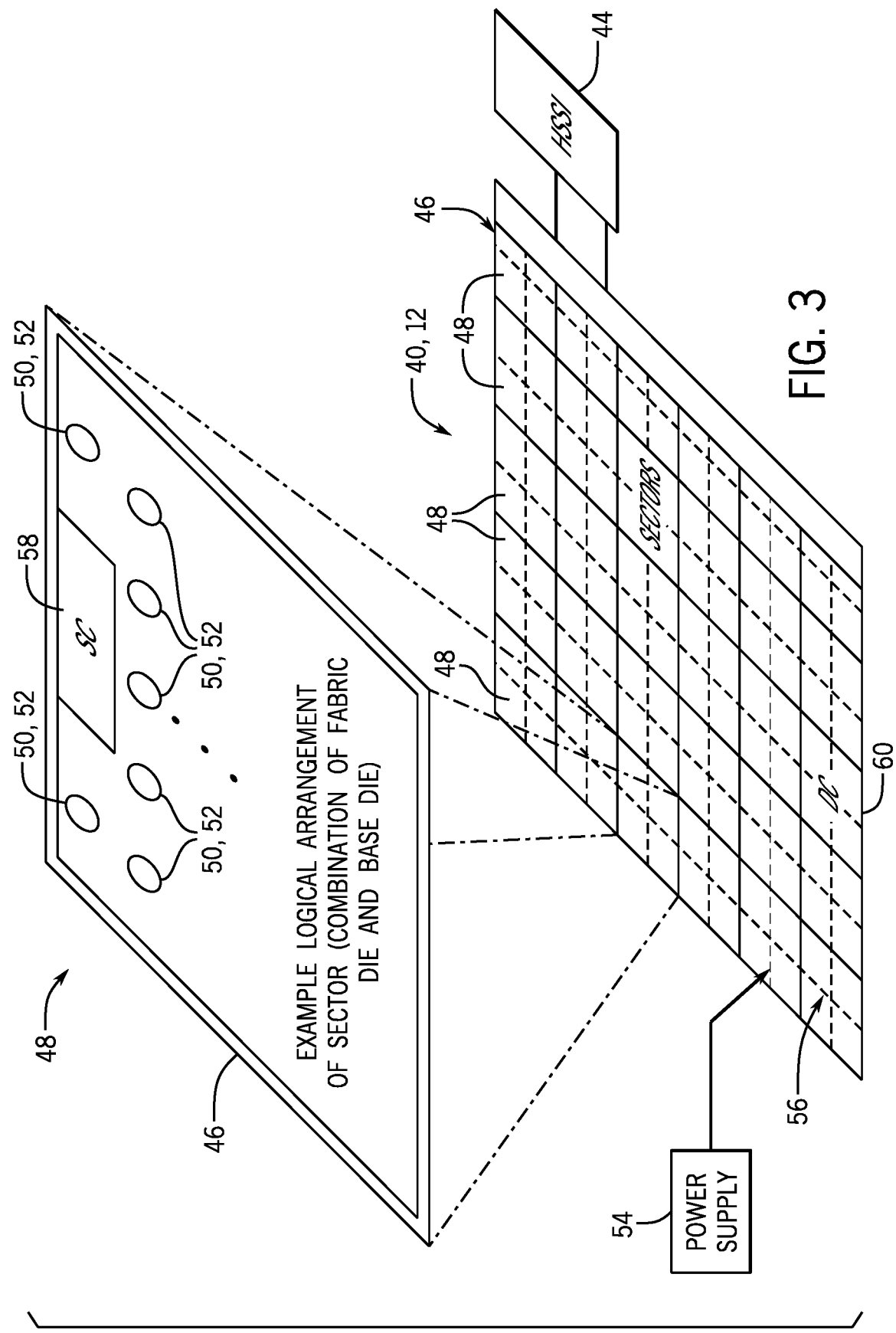
FIG. 3 is a block diagram of an example logical arrangement of the programmable logic device, in accordance with an embodiment.

In combination, the fabric die 22 and base die 24 may operate as a programmable logic device such as a field programmable gate array (FPGA). For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when the both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry (HSSI) 44 for driving signals off of the FPGA 40 and for receiving signals from other devices. The transceiver circuitry (HSSI) may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60, and may read data from and write data into its configuration memory 52 based on control signals from the device controller 60. In addition to these operations, the sector controller 58 and/or device controller 60 may be augmented with numerous additional capabilities. Such capabilities may include coordinating memory transactions between local fabric memory (e.g., local fabric memory or CRAM being used for data storage) and sector-aligned memory associated with that particular programmable logic sector 48, decrypting configuration programs (bitstreams) 18, and locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins 44 and input/output circuitry 42. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may configure the may be applied to the gates of metal-oxide-semiconductor (MOS) transistors that control the states of the programmable logic elements 50 or programmable components of the interconnection resources 46.

Figure 4:
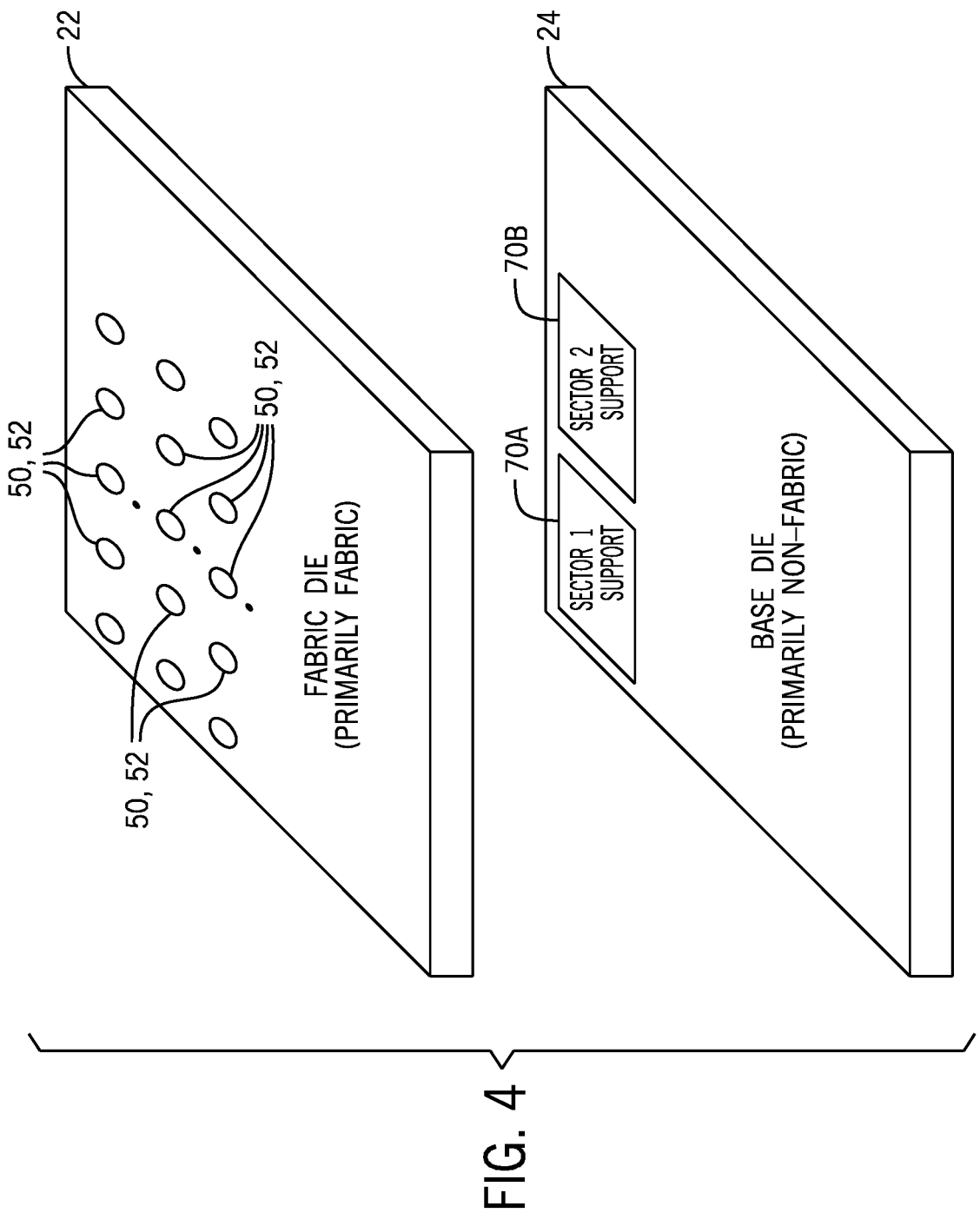
FIG. 4 is a block diagram showing a fabric die of the programmable logic device that contains programmable logic fabric and a base die of the programmable logic device that contains primarily non-fabric circuitry that operates the programmable logic fabric, in accordance with an embodiment.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50 and configuration memory 52. In some cases, this may also entail certain fabric control circuitry such as the sector controller (SC) 58 or device controller (DC) 60. The base die 24 may include supporting circuitry to operate the programmable logic elements 50 and configuration memory 52. Shown here, the base die 24 includes sector 1 support circuitry 70A and sector 2 support circuitry 70B to support two corresponding sectors of the programmable logic elements 50 and configuration memory 52 of the fabric die 22. The base die 24 may also include support circuitry for other sectors of the fabric die 22.

The fabric die 22 and the base die 24 may collectively hold any suitable circuitry that may encompass the programmable logic device 12. Thus, in one example, the fabric die 22 may include primarily programmable logic fabric resources, such as the programmable logic elements 50 and configuration memory 52, and the base die 24 may include circuitry other than the programmable logic elements 50 and configuration memory 52. These circuit elements may include, among other things, a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 24. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 5:
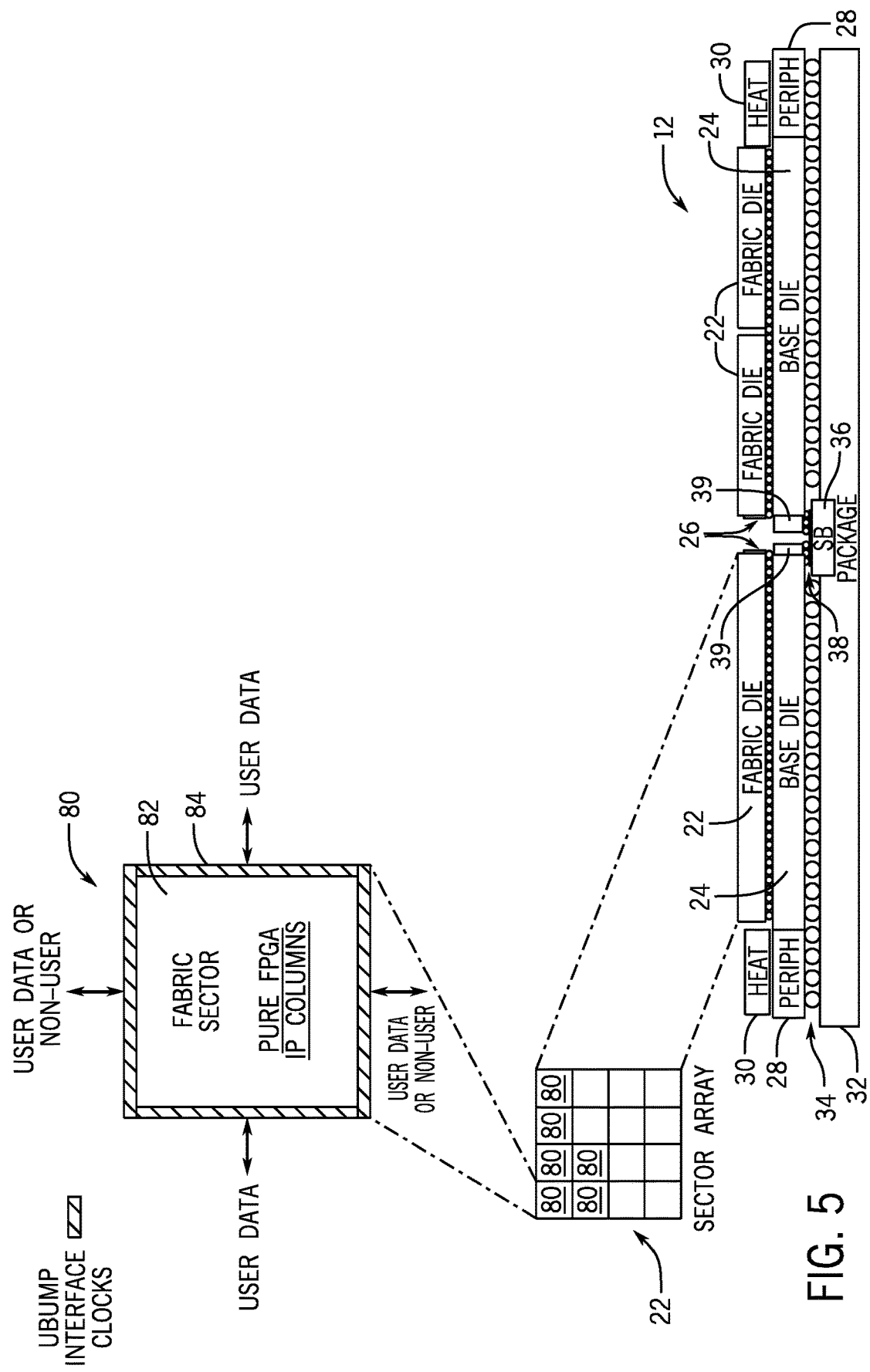
FIG. 5 is a block diagram of an example topology of the fabric die, in accordance with an embodiment.

One physical arrangement of the fabric die 22 is shown in FIG. 5. The fabric die 22 may contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources, and may contain a micro-bump (ubump) interface to connect to the base die 24.

Figure 6:
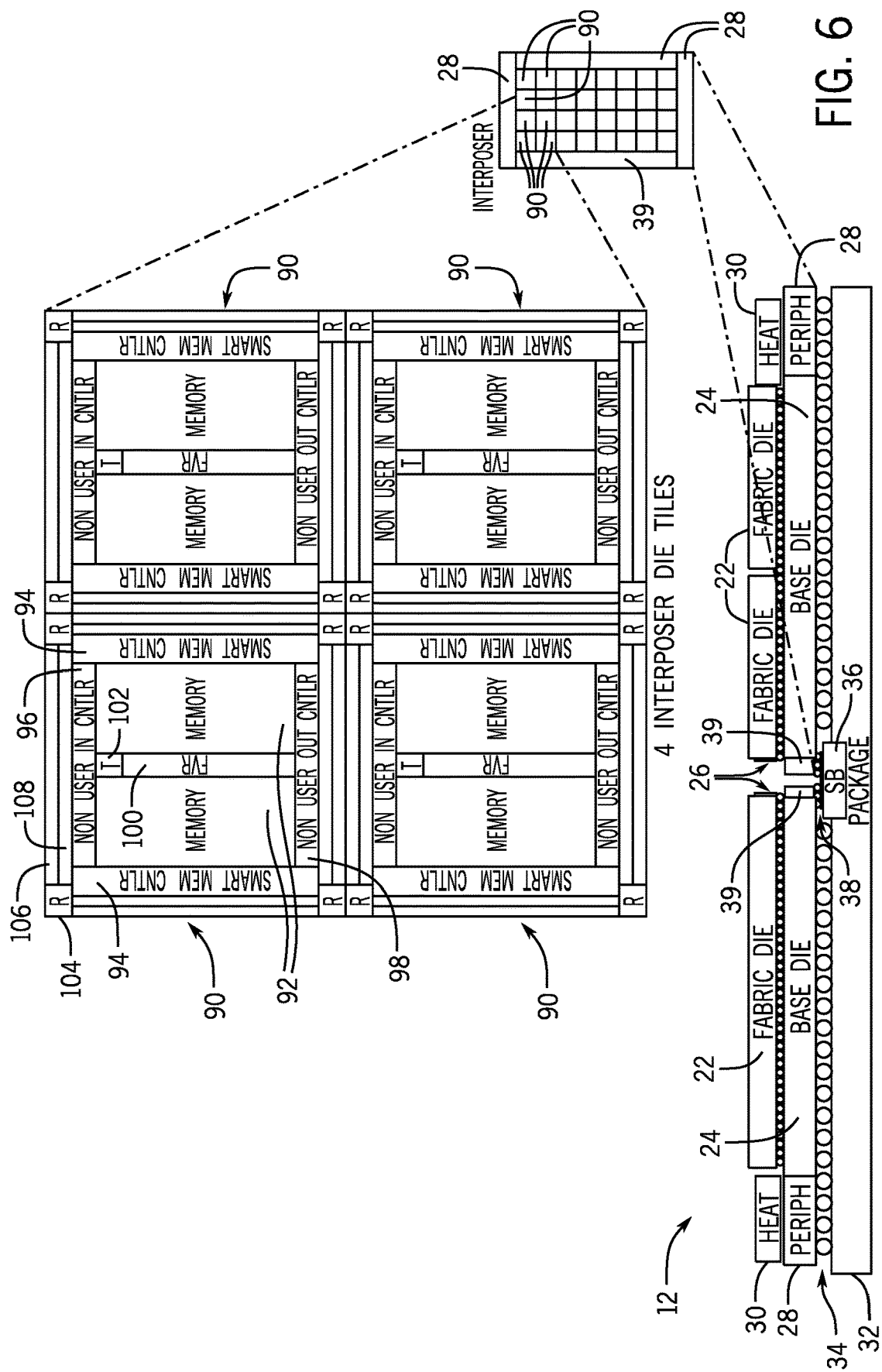
FIG. 6 is a block diagram of an example topology of the base die, in accordance with an embodiment.

FIG. 6 provides a complementary arrangement of the base die 24. The base die 24 may represent an active interposer with several sectors 90 surrounded by peripheral circuitry 28 and the silicon bridge interface 39. Each sector 90 may include a variety of fabric support circuitry, such as sector-aligned memory 92, memory control circuitry 94, non-user input control circuitry 96, non-user output control circuitry 98, a voltage regulator such as a fully integrated voltage regulator (FIVR) 100, one or more thermal sensors 102, data and configuration routers 104, and/or data pathways 106 and configuration pathways 108. The memory control circuitry 94 may be used to program the sector-aligned memory 92, the CRAM of the fabric die 22, or both. The non-user input control circuitry 96 and non-user output control circuitry 98 may allow the circuitry of the sectors 90 to exchange data and/or control signals (e.g., via configurable data routing network-on-chip (NOC) or a configuration network on chip (CNOC)). In one example, the non-user input control circuitry 96 and non-user output control circuitry 98 may operate as the sector controller (SC) 58 for a corresponding fabric sector 80 (as shown in FIG. 5). The FIVR 100 and the one or more thermal sensors 102 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 102 and/or in accordance with a dynamic voltage and frequency scaling (DVFS) scheme). Even though the thermal sensors 102 are in a separate die from that of the programmable logic fabric elements, when the base die 24 is directly adjacent to the fabric die 22 as in this example, the temperature measured by the thermal sensor 102 in the base die 24 may correspond well enough to the fabric die 22 to allow for temperature-based operations (e.g., turn off power to the corresponding fabric sector 80 to prevent a permanent denial-of-service (PDOS) condition).

Figure 7:
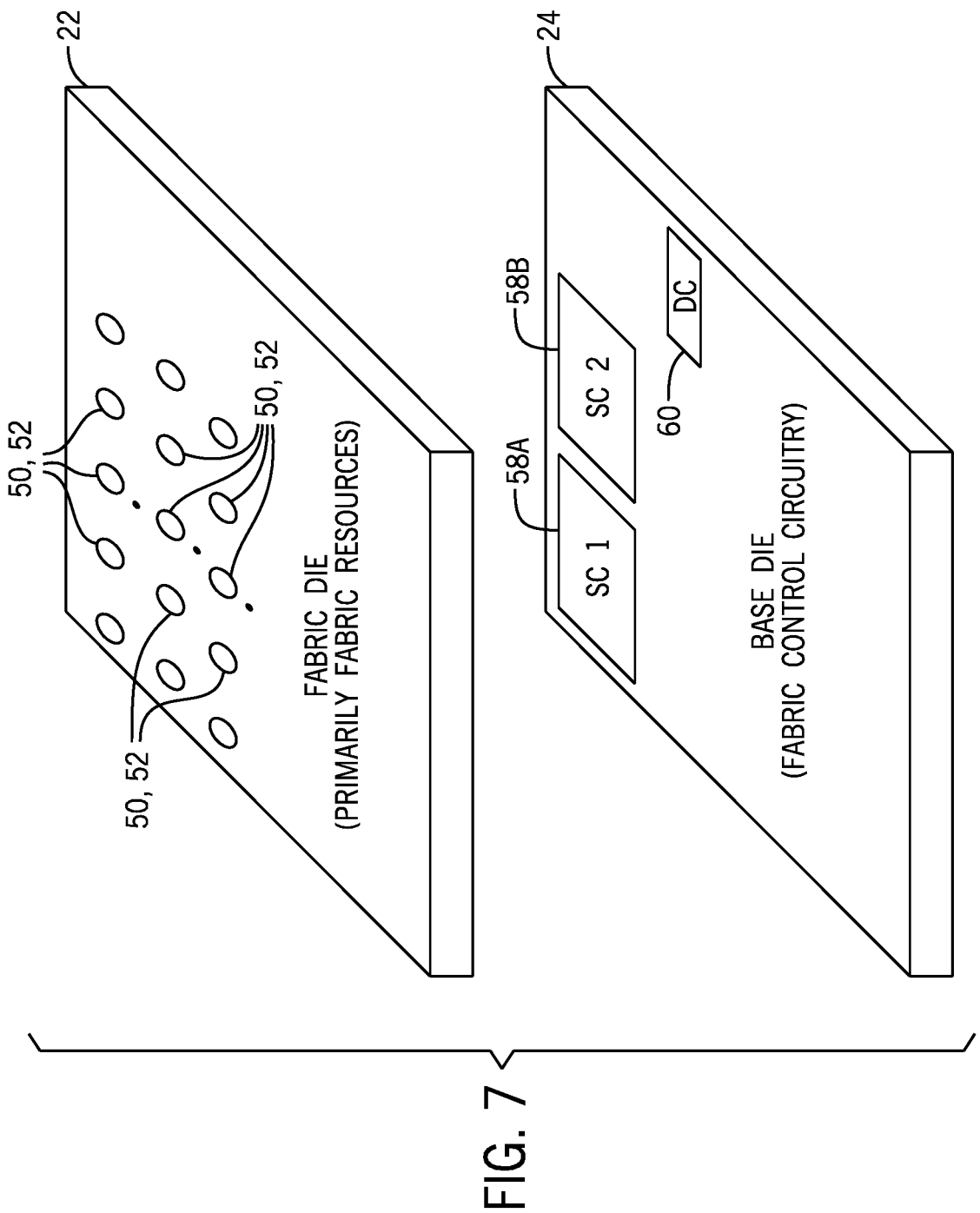
FIG. 7 is a block diagram showing a fabric die of the programmable logic device that contains programmable logic fabric and a base die of the programmable logic device that contains fabric control circuitry that controls the programmable logic fabric, in accordance with an embodiment.

While the physical arrangement shown in FIGS. 5 and 6 represent one example of the division of programmable logic device circuitry between the fabric die 22 and the base die 24, there are many suitable arrangements. For example, as shown in FIG. 7, the fabric die 22 may contain fabric resources, such as programmable logic elements 50 and associated configuration memory 52, and the base die 24 may contain control circuitry, such as sector controllers 58 (e.g., a first sector controller (SC 1) 58A and a second sector controller (SC 2) 58B) and a device controller 60. The depicted resources may represent or may be contained in the sectors 90 mentioned above. Other programmable logic device elements not shown in FIG. 7 may be contained in the fabric die 22, the base die 24, or both.

Figure 8:
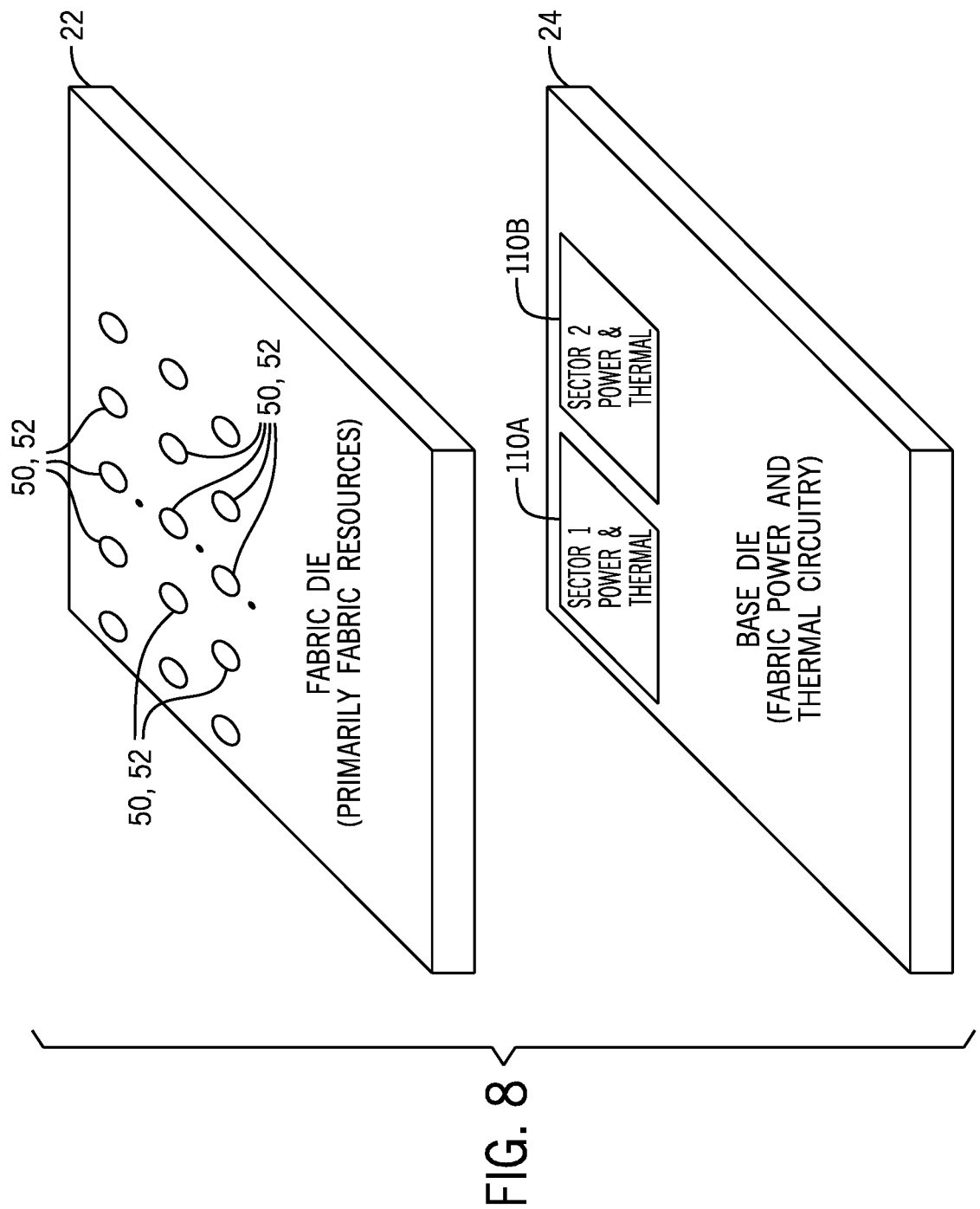
FIG. 8 is a block diagram showing a fabric die of the programmable logic device that contains programmable logic fabric and a base die of the programmable logic device that contains power and thermal circuitry for the programmable logic fabric, in accordance with an embodiment.

In another example, shown in FIG. 8, the fabric die 22 may contain fabric resources, such as programmable logic elements 50 and associated configuration memory 52, and the base die 24 may contain power and thermal circuitry (e.g., sector 1 power & thermal circuitry 110A and sector 2 power & thermal circuitry 110B), which may contain voltage regulators, thermal sensors, or the like. The depicted resources may represent or may be contained in the sectors 90 mentioned above. Other programmable logic device elements not shown in FIG. 8 may be contained in the fabric die 22, the base die 24, or both.

Figure 9:
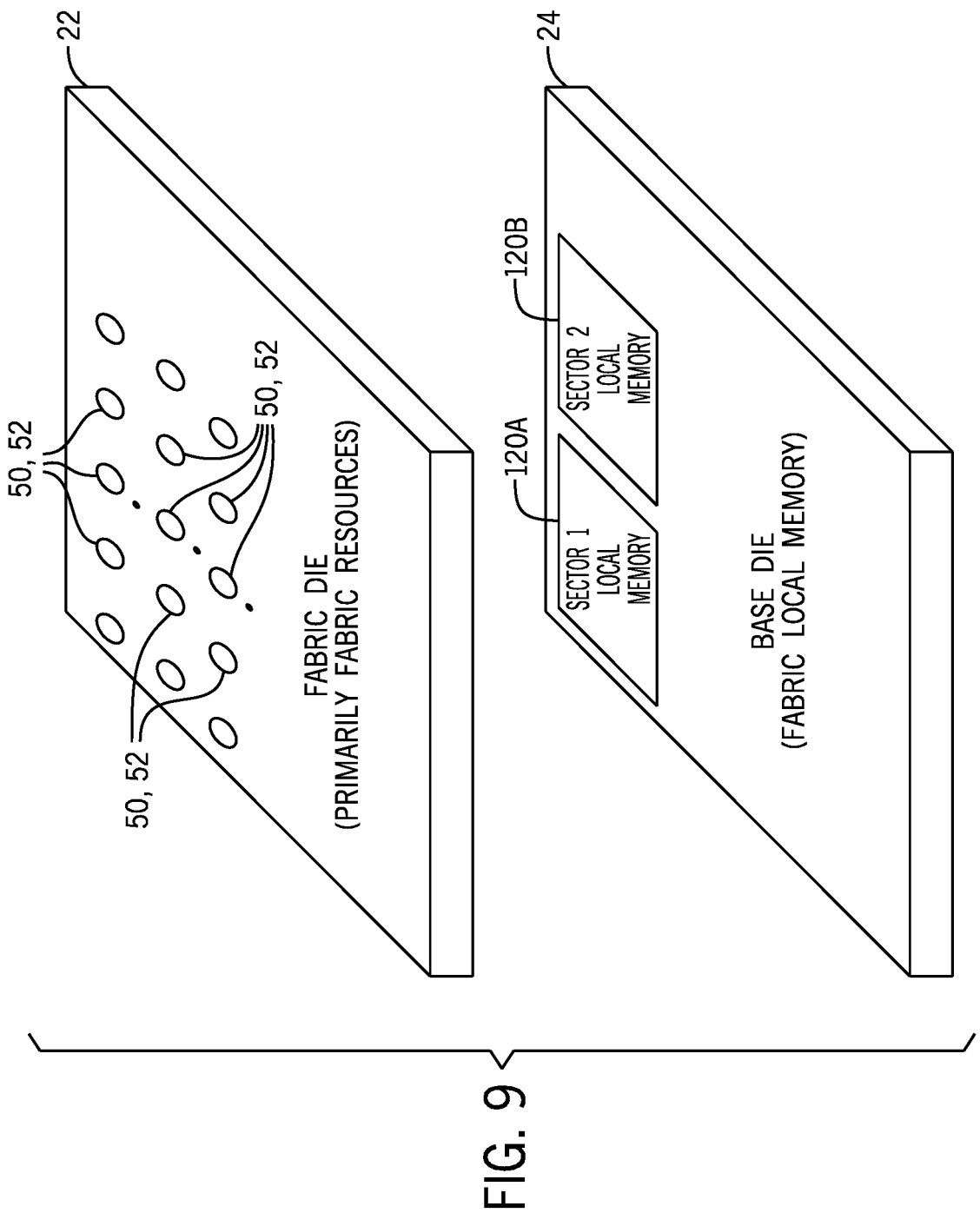
FIG. 9 is a block diagram showing a fabric die of the programmable logic device that contains programmable logic fabric and a base die of the programmable logic device that contains memory circuitry for the programmable logic fabric, in accordance with an embodiment.

In another example, shown in FIG. 9, the fabric die 22 may contain fabric resources, such as programmable logic elements 50 and associated configuration memory 52, and the base die 24 may contain memory resources. The memory resources are shown by way of example as sector 1 local memory 120A and sector 2 local memory 120B, and may include memory controllers (e.g., the memory controllers 94 shown in FIG. 6) and/or sector-aligned memory (e.g., the sector-aligned memory 92 shown in FIG. 6). The depicted resources of the base die 24 may represent or may be contained in the sectors 90 mentioned above. Other programmable logic device elements not shown in FIG. 9 may be contained in the fabric die 22, the base die 24, or both.

Figure 10:
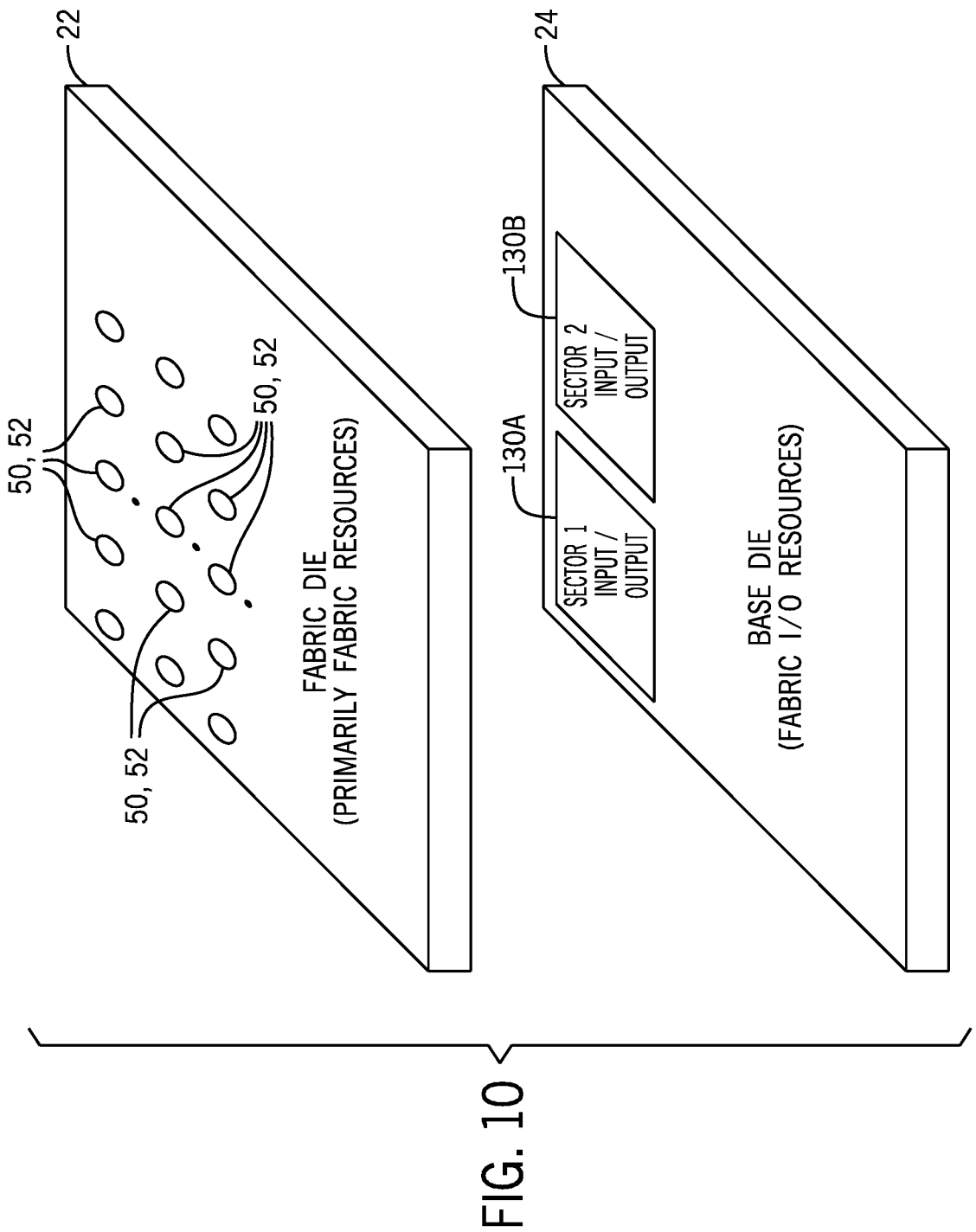
FIG. 10 is a block diagram showing a fabric die of the programmable logic device that contains programmable logic fabric and a base die of the programmable logic device that contains input/output (I/O) circuitry for the programmable logic fabric, in accordance with an embodiment.

In another example, shown in FIG. 10, the fabric die 22 may contain fabric resources, such as programmable logic elements 50 and associated configuration memory 52, and the base die 24 may contain input/output (I/O) resources. The I/O resources are shown by way of example as sector 1 input/output circuitry 130A and sector 2 input/output circuitry 130B, and may include any suitable I/O circuitry. The I/O circuitry may represent an I/O bank (e.g., an IO48 module used in Intel® programmable logic devices). In some cases, the I/O circuitry may include analog transceiver circuitry. The depicted resources of the base die 24 may represent or may be contained in the sectors 90 mentioned above. Other programmable logic device elements not shown in FIG. 10 may be contained in the fabric die 22, the base die 24, or both.

Figure 11:
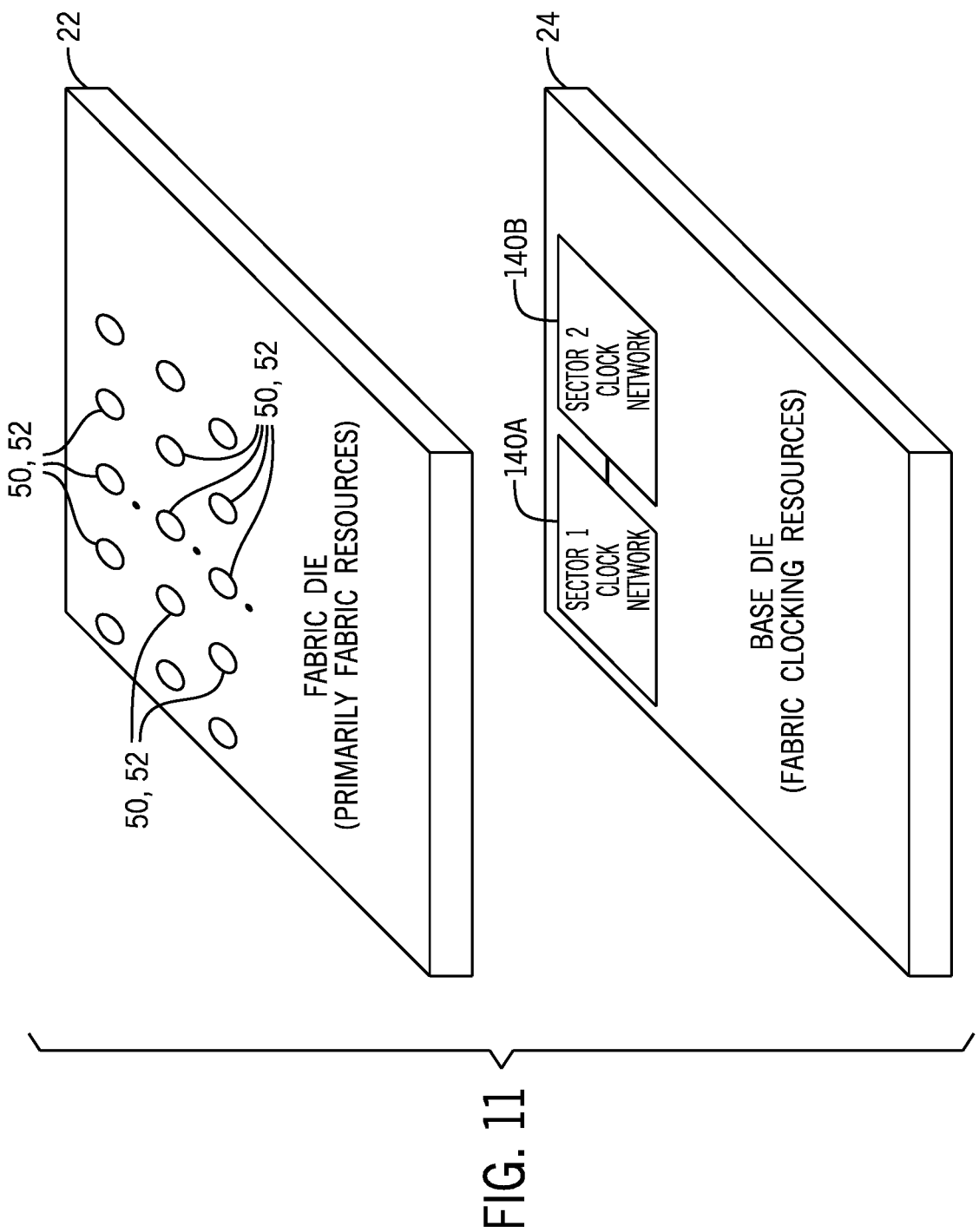
FIG. 11 is a block diagram showing a fabric die of the programmable logic device that contains programmable logic fabric and a base die of the programmable logic device that contains clocking circuitry for the programmable logic fabric, in accordance with an embodiment.

In another example, shown in FIG. 11, the fabric die 22 may contain fabric resources, such as programmable logic elements 50 and associated configuration memory 52, and the base die 24 may contain fabric clocking resources. The fabric clocking resources are shown by way of example as sector 1 clock network circuitry 140A and sector 2 clock network circuitry 140B, and may include any suitable clock generation and/or distribution circuitry (e.g., phase-locked-loops (PLLs), a fixed clock tree, a configurable clock tree, or the like). The depicted resources of the base die 24 may represent or may be contained in the sectors 90 mentioned above. Other programmable logic device elements not shown in FIG. 11 may be contained in the fabric die 22, the base die 24, or both.

Figure 12:
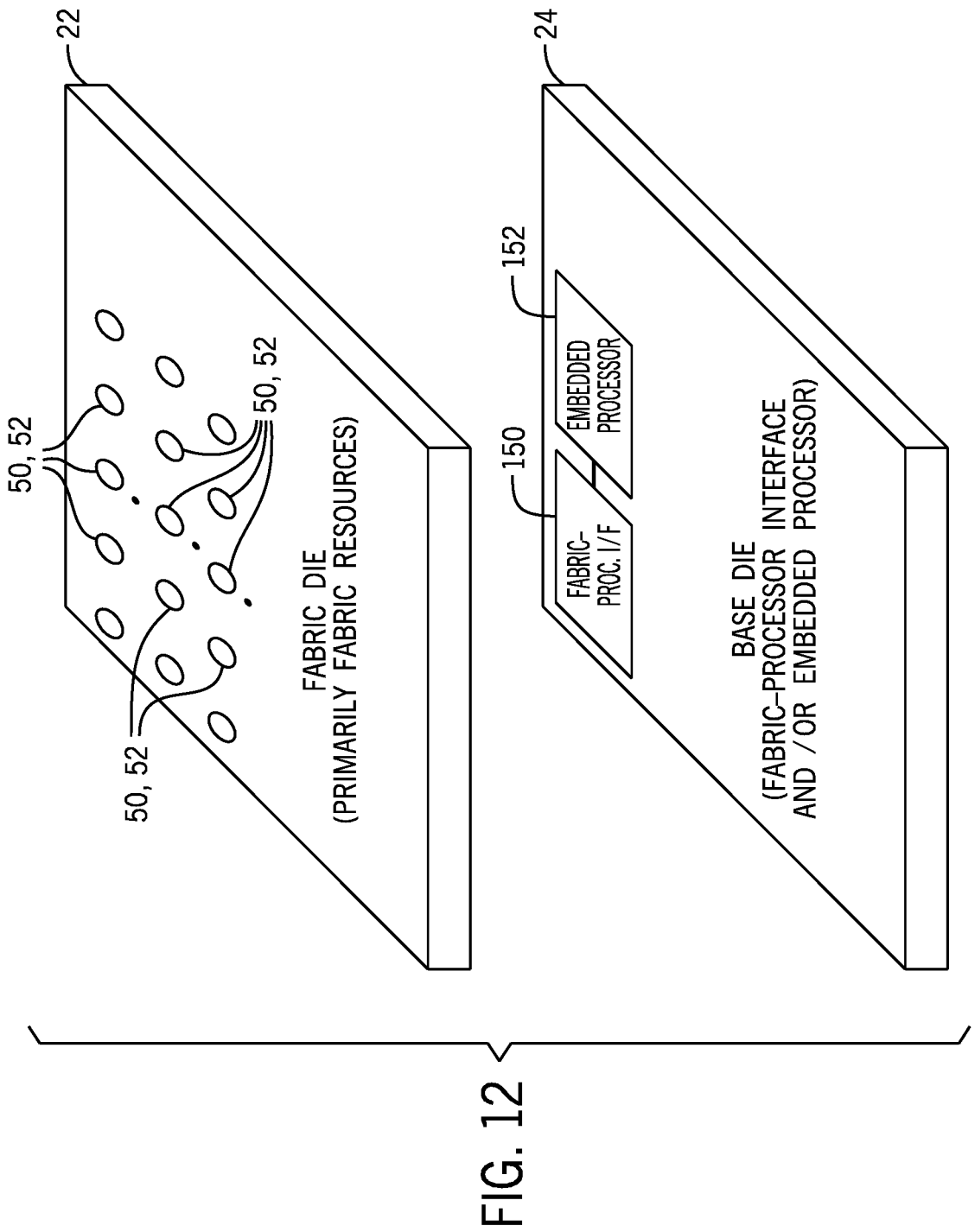
FIG. 12 is a block diagram showing a fabric die of the programmable logic device that contains programmable logic fabric and a base die of the programmable logic device that contains processing circuitry for the programmable logic fabric, in accordance with an embodiment.

In another example, shown in FIG. 12, the fabric die 22 may contain fabric resources, such as programmable logic elements 50 and associated configuration memory 52, and the base die 24 may contain processor resources. The processor resources are shown by way of example as a fabric-processor interface 150 and an embedded processor 152. The fabric-processor interface 150 may connect the fabric resources of the fabric die 22 to the embedded processor 152. The embedded processor 152 may represent, for example, an Intel® Xeon® processor or a reduced-instruction processor such as an Advanced RISC Machine (ARM) processor. The depicted resources of the base die 24 may represent or may be contained in the sectors 90 mentioned above. Other programmable logic device elements not shown in FIG. 12 may be contained in the fabric die 22, the base die 24, or both.

Figure 13:
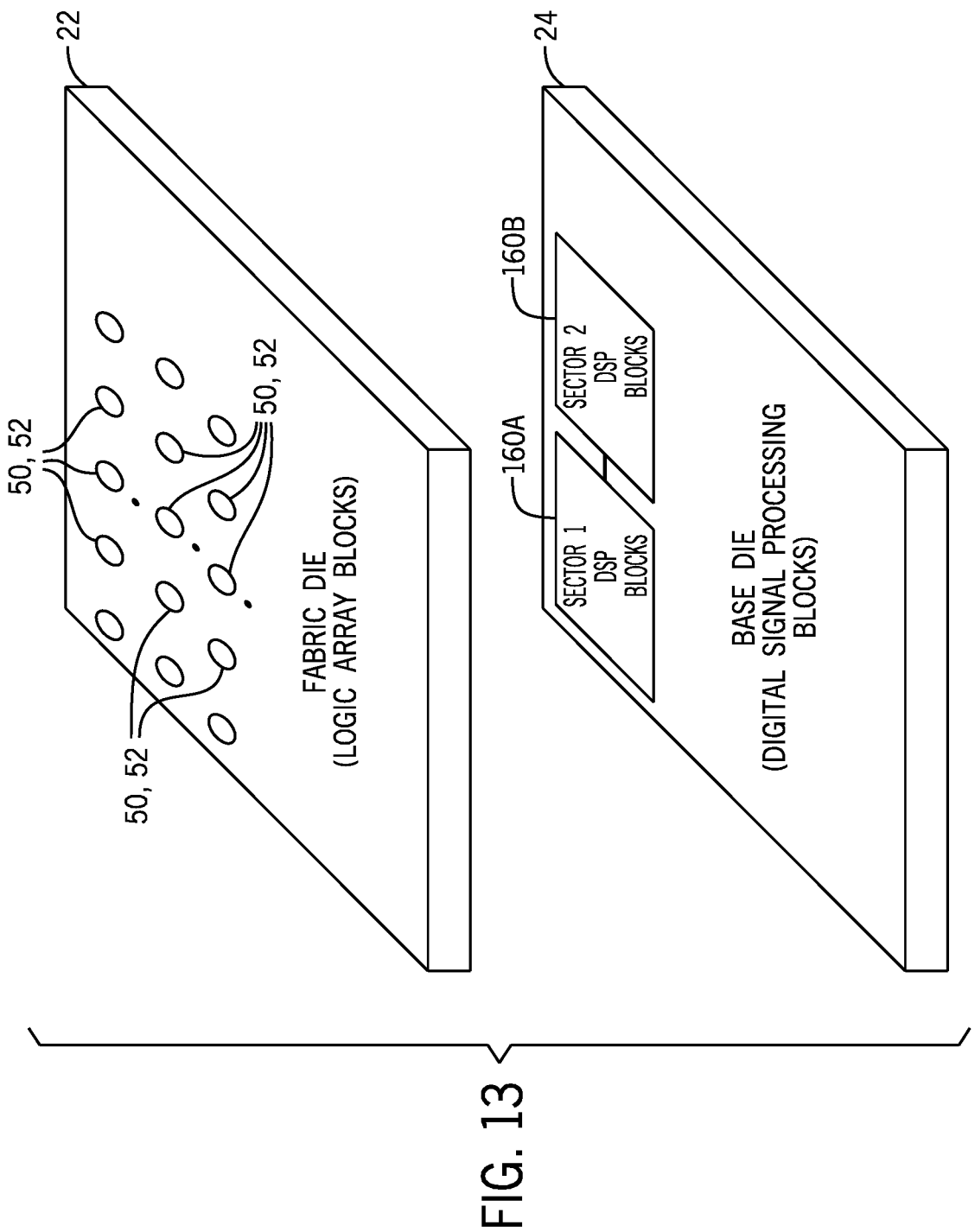
FIG. 13 is a block diagram showing a fabric die of the programmable logic device that contains programmable logic fabric and a base die of the programmable logic device that contains mathematical processing circuitry for the programmable logic fabric, in accordance with an embodiment.

In another example, shown in FIG. 13, the fabric die 22 may contain fabric resources, such as programmable logic elements 50 and associated configuration memory 52 (e.g., in logic array blocks (LABs)), and the base die 24 may contain (fixed or programmable) mathematical resources. The mathematical resources are shown by way of example as sector 1 digital signal processing (DSP) block 160A and sector 1 digital signal processing (DSP) block 160B. In this example, mathematical elements such as multipliers, adders, accumulators, dividers, and the like, may be disposed in the base die 24, leaving the fabric die 22 to be populated primarily by the LABs containing the programmable logic elements 50 and associated configuration memory 52. The depicted resources of the base die 24 may represent or may be contained in the sectors 90 mentioned above. Other programmable logic device elements not shown in FIG. 13 may be contained in the fabric die 22, the base die 24, or both.

Figure 14:
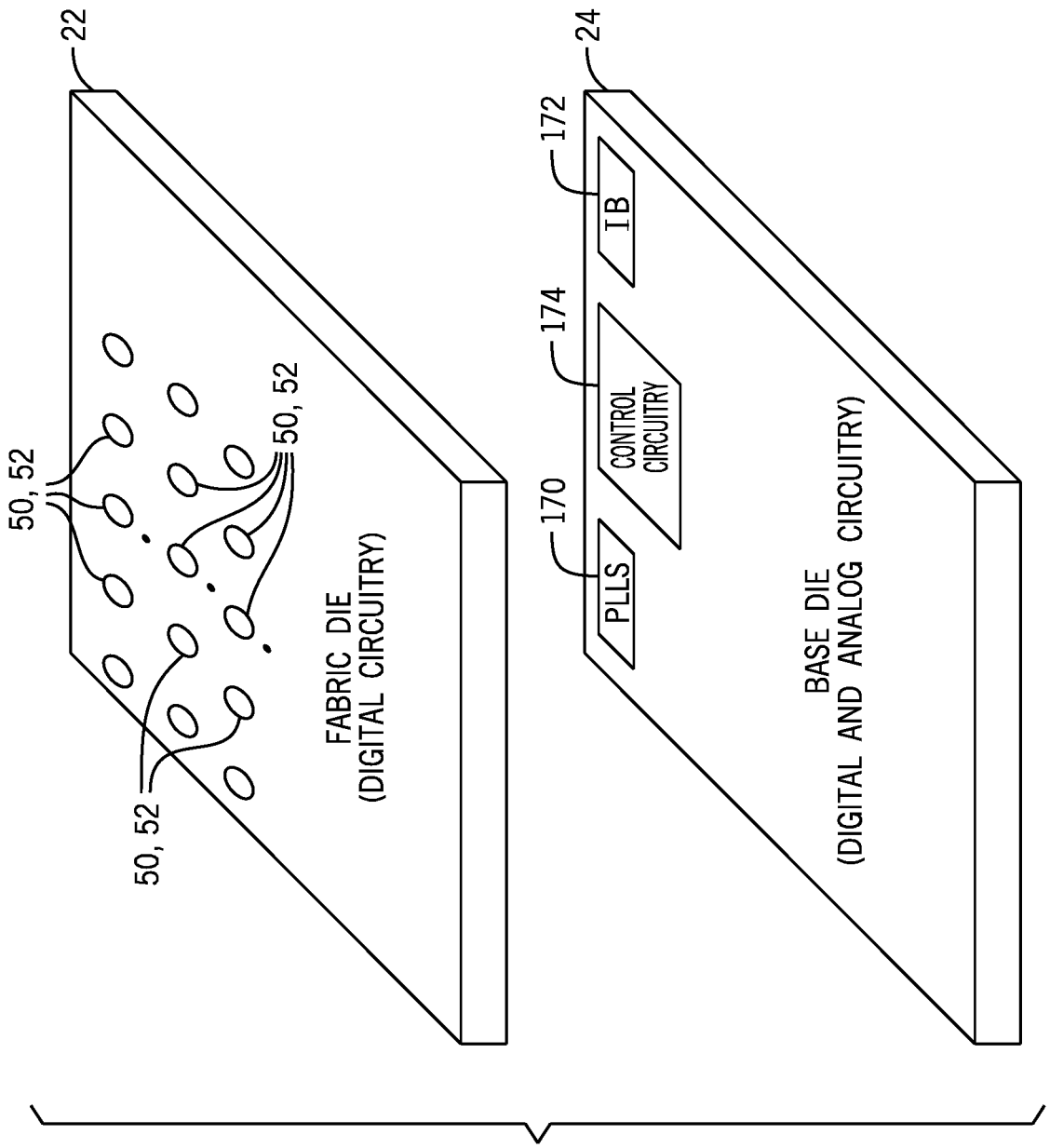
FIG. 14 is a block diagram showing a fabric die of the programmable logic device that contains digital circuitry and a base die of the programmable logic device that contains digital and analog circuitry, in accordance with an embodiment.

In another example, shown in FIG. 14, the fabric die 22 may contain digital circuitry, such as programmable logic elements 50 and associated configuration memory 52, but may contain comparatively little or no analog circuitry. Instead, analog circuitry such as phase-locked-loops (PLLs) 170 and analog interfaces (e.g., analog interface bridge circuitry (IB) 172), along with corresponding control circuitry 174, may be found on the base die 24. Since the fabric die 22 may contain substantially only digital circuitry, the fabric die 22 may be updated to newer lithography processes more quickly than the base die 24. This may allow the fabric die 22 to be rapidly scaled to include a higher density of programmable logic elements 50 and associated configuration memory 52 as new lithographic techniques become available. Meanwhile, the base die 24 may be updated to newer lithography processes at a different rate or on a different timeline. The depicted resources of the base die 24 may represent or may be contained in the sectors 90 mentioned above. Other analog programmable logic device elements not shown in FIG. 14 may be contained in the base die 24, while other digital programmable logic device elements not shown in FIG. 14 may be contained in the fabric die 22, the base die 24, or both.

Figure 15:
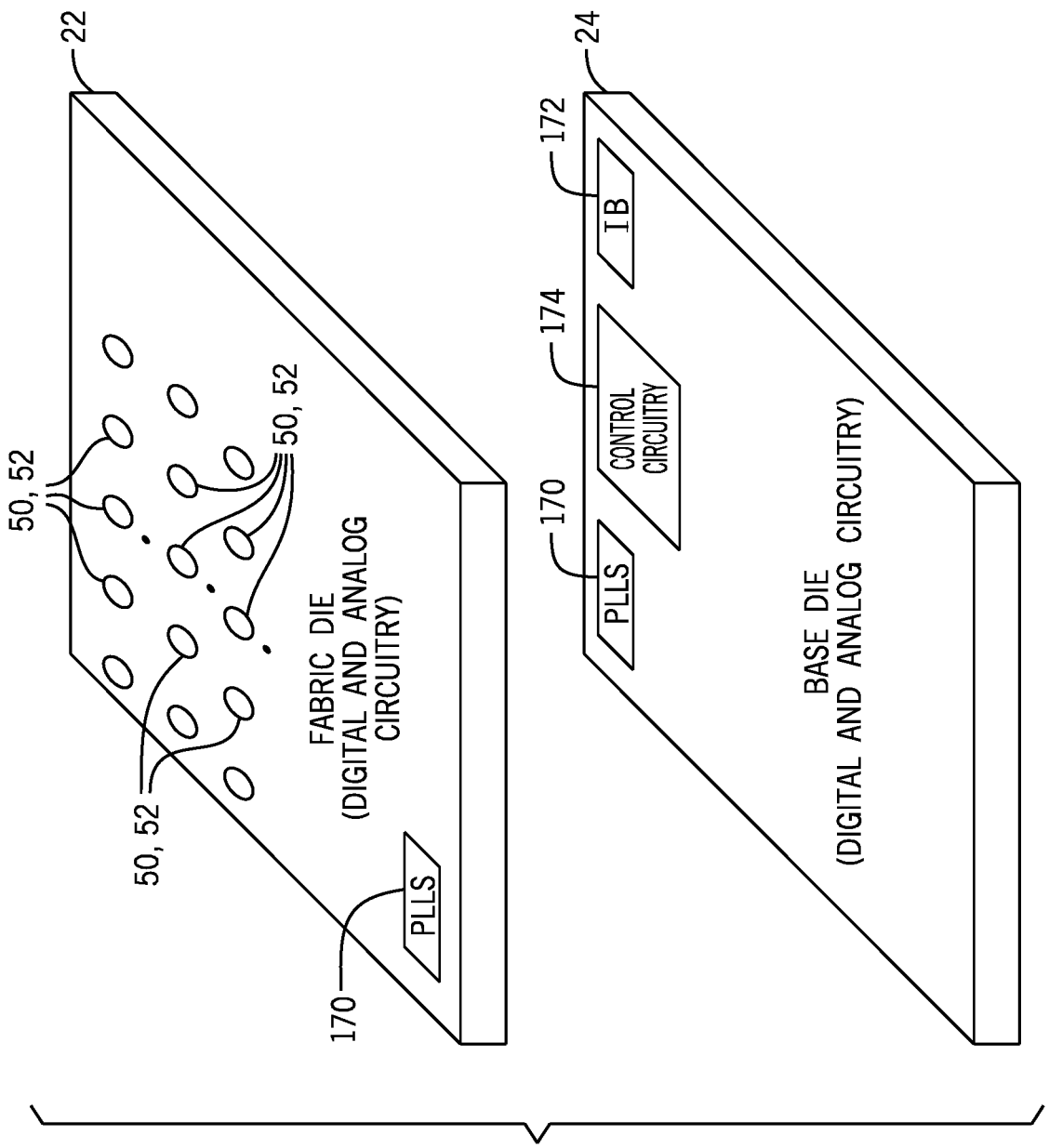
FIG. 15 is a block diagram showing a fabric die of the programmable logic device that contains digital and analog circuitry and a base die of the programmable logic device that contains digital and analog circuitry, in accordance with an embodiment.

As shown in FIG. 15, both the fabric die 22 and the base die 24 may contain digital and analog circuitry. The fabric die may contain programmable fabric, such as programmable logic elements 50 and associated configuration memory 52, as well as some analog circuitry. For example, both the fabric die 22 and the base die 24 may include certain analog circuitry such as phase-locked-loops (PLLs) 170. Other analog circuitry, such as analog interfaces (e.g., analog interface bridge circuitry (IB) 172), along with corresponding control circuitry 174, may be found on the base die 24. The depicted resources of the base die 24 may represent or may be contained in the sectors 90 mentioned above. Other programmable logic device elements not shown in FIG. 15 may be contained in the fabric die 22, the base die 24, or both.

Figure 16:
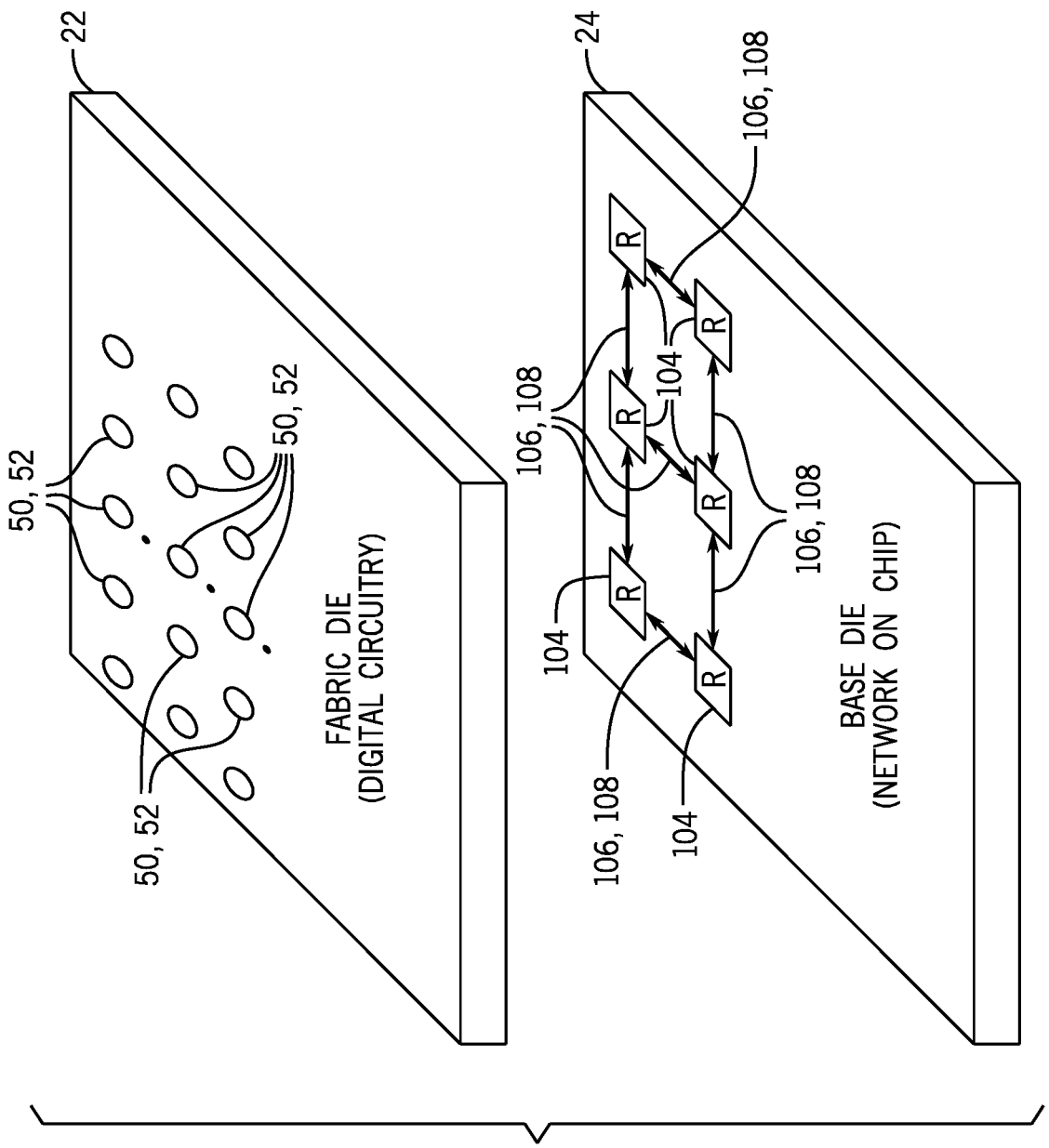
FIG. 16 is a block diagram showing a fabric die of the programmable logic device that contains programmable logic fabric circuitry and a base die of the programmable logic device that contains a network-on-chip for the programmable logic fabric circuitry, in accordance with an embodiment.

In another example, shown in FIG. 16, the fabric die 22 may contain fabric resources, such as programmable logic elements 50 and associated configuration memory 52, and the base die 24 may contain networking resources for transferring configuration data or other data within, between, or to different fabric sectors 80 of the programmable logic device 12. For instance, the base die 24 may include routers 104 and data pathways 106 and/or configuration pathways 108. These may represent a network-on-chip (NOC) and/or configuration network-on-chip (CNOC) that can be used to transfer configuration data or other data within, between, or to the fabric sectors 80. The depicted resources of the base die 24 may represent or may be contained in the sectors 90 mentioned above. Other programmable logic device elements not shown in FIG. 16 may be contained in the fabric die 22, the base die 24, or both.

Figure 17:
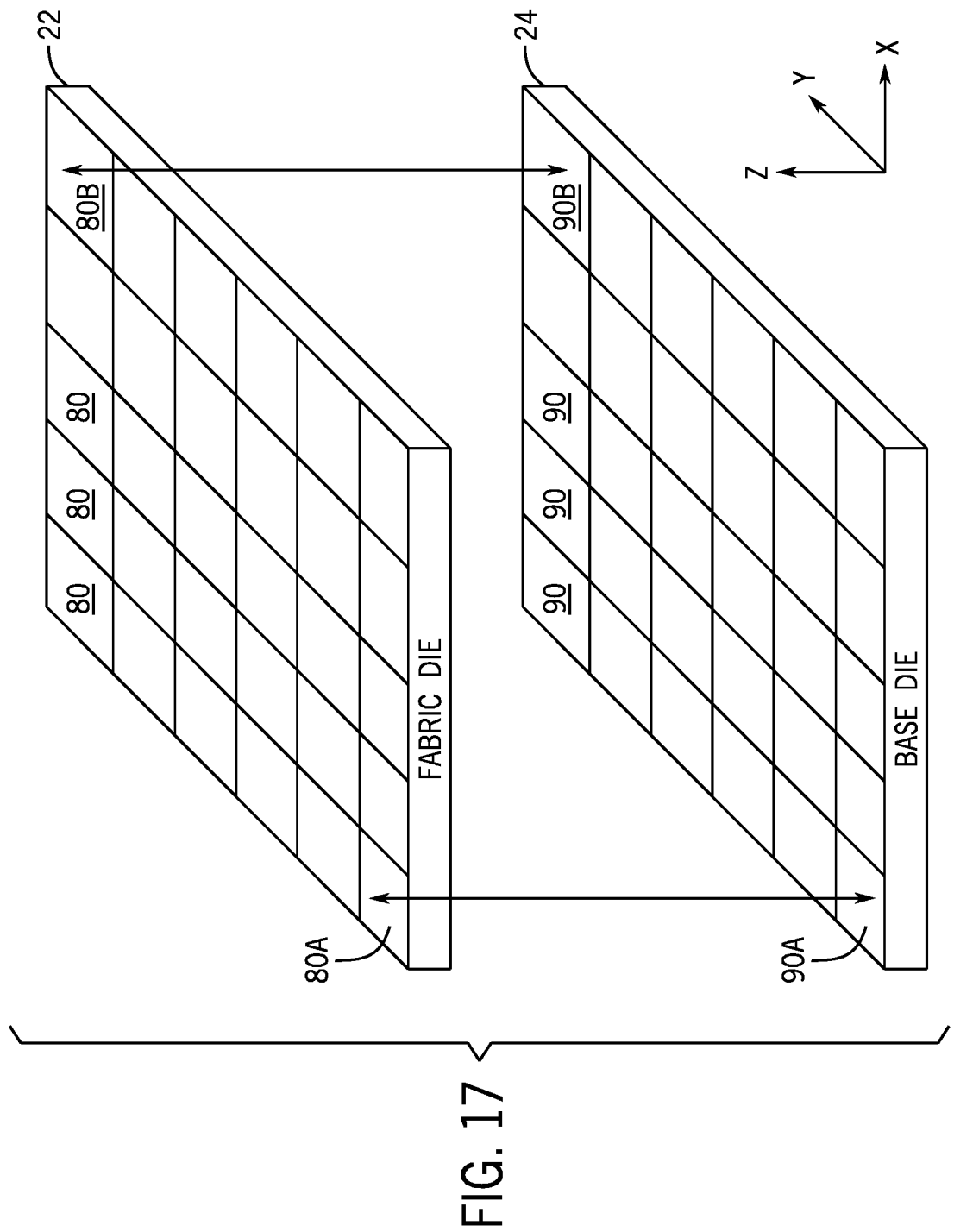
FIG. 17 is a block diagram showing a vertical alignment between sectors of the fabric die and sectors of the base die, in accordance with an embodiment.

To facilitate efficient communication, the fabric die 22 and the base die 24 may be vertically sector-aligned. In one example, shown in FIG. 17, the fabric sectors 80 of the fabric die 22 may be vertically aligned (i.e., may interface in the z-direction) with the sectors 90 of the base die 24. Moreover, the fabric sectors 80 of the fabric die 22 may have substantially the same area (i.e., may occupy substantially the same distance in the x- and y-direction) as the sectors 90 of the base die 24. Thus, as shown in FIG. 17, a first sector 90A may vertically align with a first fabric sector 80A, and a second sector 90B may vertically align with a second fabric sector 80B. It should be noted that the base die 24 may also include additional circuitry in areas beyond the fabric die 22 (not shown in FIG. 17).

Figure 18:
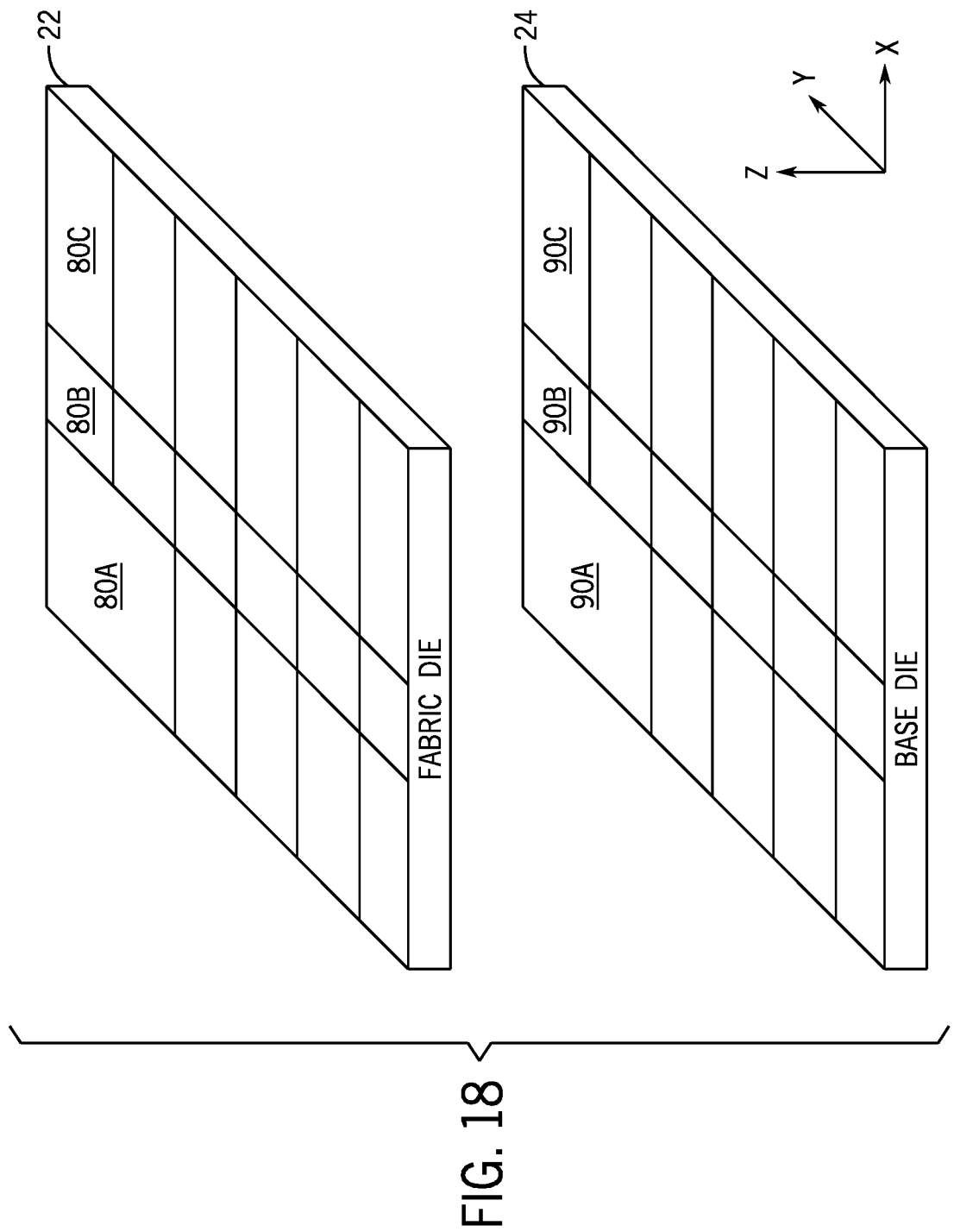
FIG. 18 is a block diagram showing a vertical alignment between variably sized sectors of the fabric die and correspondingly sized sectors of the base die, in accordance with an embodiment.
Figure 19:
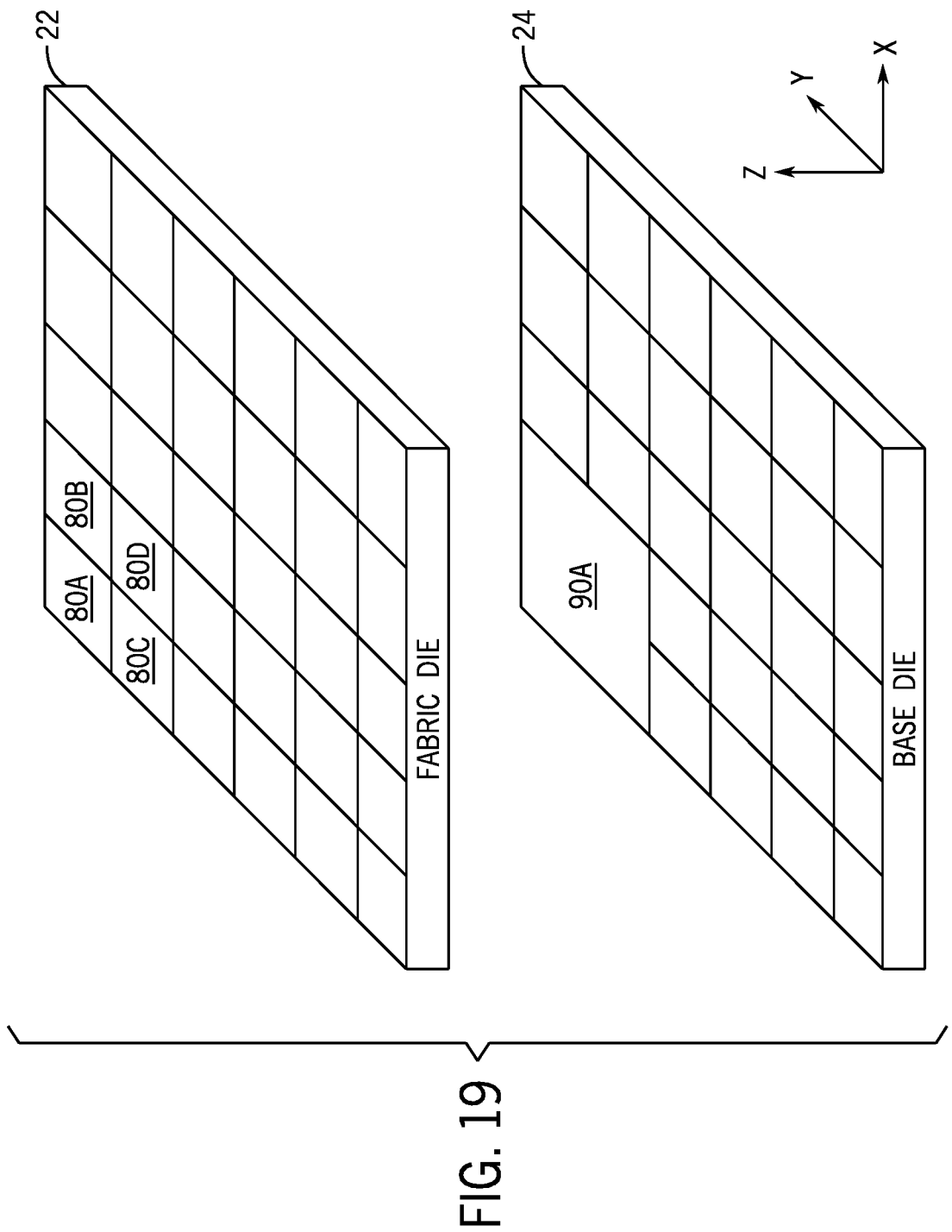
FIG. 19 is a block diagram showing a vertical alignment between a first number of sectors of the fabric die with a different number of sectors of the base die, in accordance with an embodiment.

In some cases, the fabric sectors 80 and the sectors 90 may not occupy the same amount of area. Indeed, as shown in FIG. 18, a first sector 90A may be larger than a second sector 90B or a third sector 90C, and the third sector 90C may be larger than the second sector 90B. Corresponding fabric sectors 80A, 80B, and 80C may occupy the same areas as, and vertically align with, the respective sectors 90A, 90B, and 90C. In other cases, the sectors 90 may have different sizes from that of the fabric sectors 80, as shown in FIG. 19. For instance, a larger sector (e.g., sector 90A) may be vertically aligned with and may contain fabric support circuitry to support multiple fabric sectors (e.g., fabric sectors 80A, 80B, 80C, and 80D).

Figure 20:
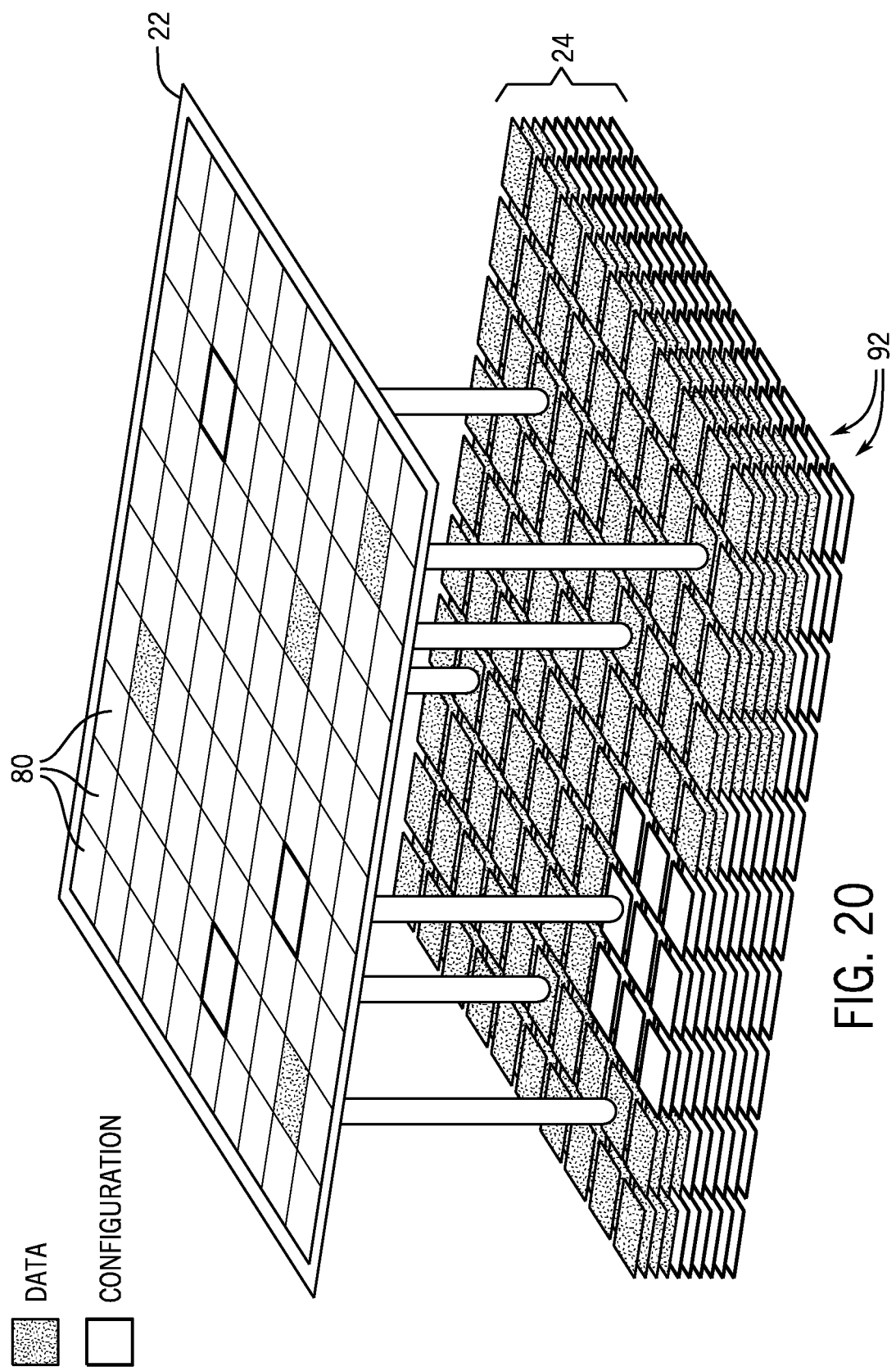
FIG. 20 is a schematic block diagram of sector-aligned memory of the base die that may support rapid configuration and/or caching for corresponding sectors of the fabric die, in accordance with an embodiment.

By vertically aligning the fabric die 22 and the base die 24, memory located in the base die 24 may be accessible in parallel to fabric sectors 80 of the fabric die 22. FIG. 20 shows an example in which sector-aligned memory 92 may be contained in the base die 24. The sector-aligned memory 92 may be accessible to respective fabric sectors 80 of the fabric die 22, and may contain user data (generated by or accessible by a circuit design programmed into the programmable logic fabric of the base die 24) or configuration data that may be used to program the programmable logic fabric of the base die 24. In the example of FIG. 20, the fabric sectors 80 may access specific regions of sector-aligned memory 92. The sector-aligned memory 92 is shown in FIG. 20 as vertically stacked memory. This may allow a large amount of memory to be located within the base die 24. However, the sector-aligned memory 92 may occupy a single plane of the base die 24 in some embodiments.

Figure 21:
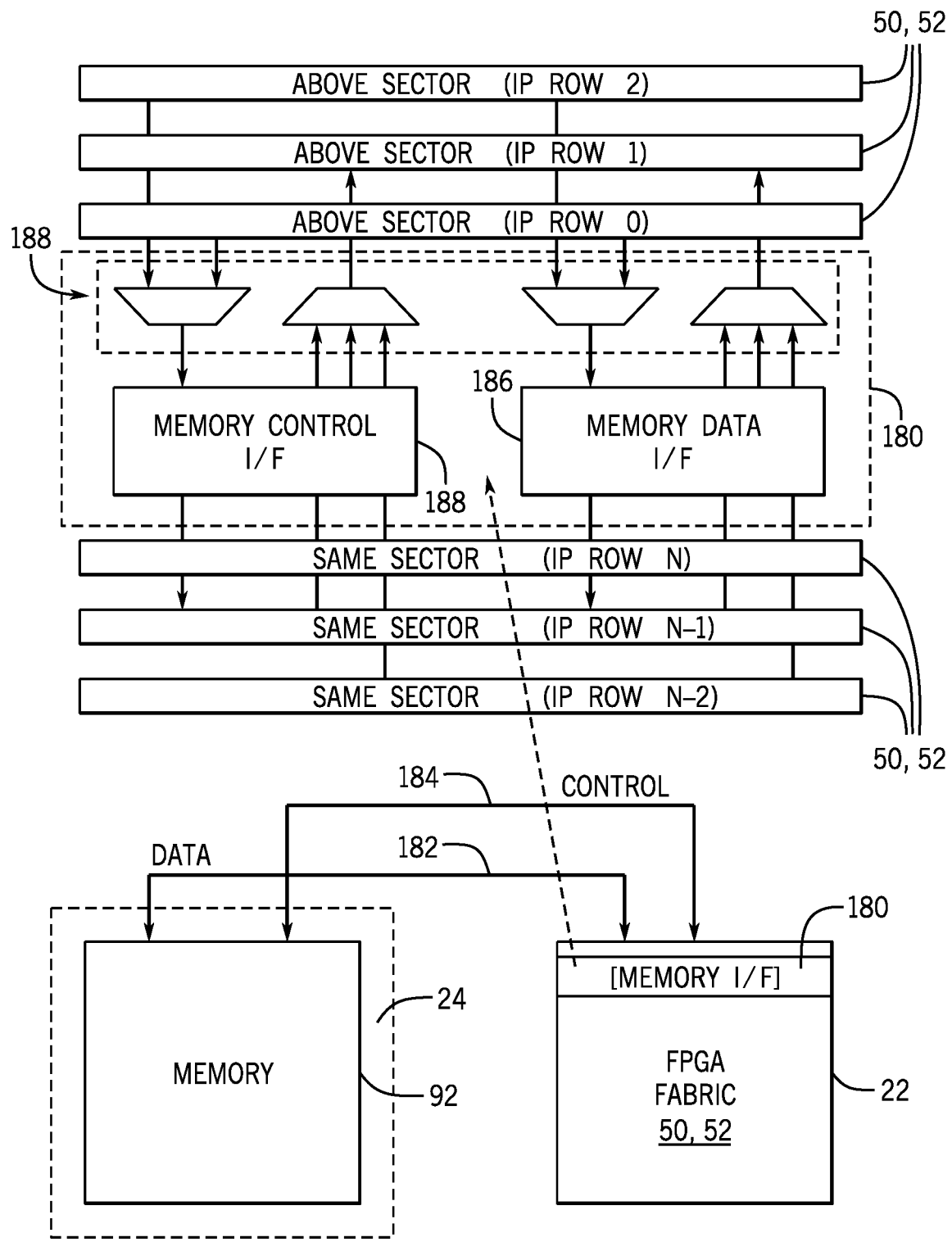
FIG. 21 is a block diagram of a memory interface of the fabric die to interface with the sector-aligned memory of the base die, in accordance with an embodiment.

As shown in FIG. 21, the sector-aligned memory 92 of the base die 24 may be accessible by the programmable logic fabric (e.g., programmable logic elements 50 and associated configuration memory 52) of the fabric die 22 via a memory interface (I/F) 180. The memory interface (I/F) 180 may occupy a row of a fabric sector 80. In the example of FIG. 21, the memory interface (I/F) 180 may occupy an outermost row of a fabric sector 80. This may allow the memory interface (I/F) 180 to facilitate communication not just with rows of programmable logic elements 50 and associated configuration memory 52 in the fabric sector 80 where the memory interface (I/F) 180 is located, but also with rows of programmable logic elements 50 and associated configuration memory 52 in an adjacent fabric sector 80. The memory interface (I/F) 180 may receive or transmit data via a data path 182 and may communicate control signals via a control signal path 184. A memory data interface (I/F) 186 and a memory control interface (I/F) 188 may receive control and/or data signals and route them through the rows of programmable logic elements 50 and associated configuration memory 52 to a particular memory address or logic element via routing circuitry 189.

Figure 22:
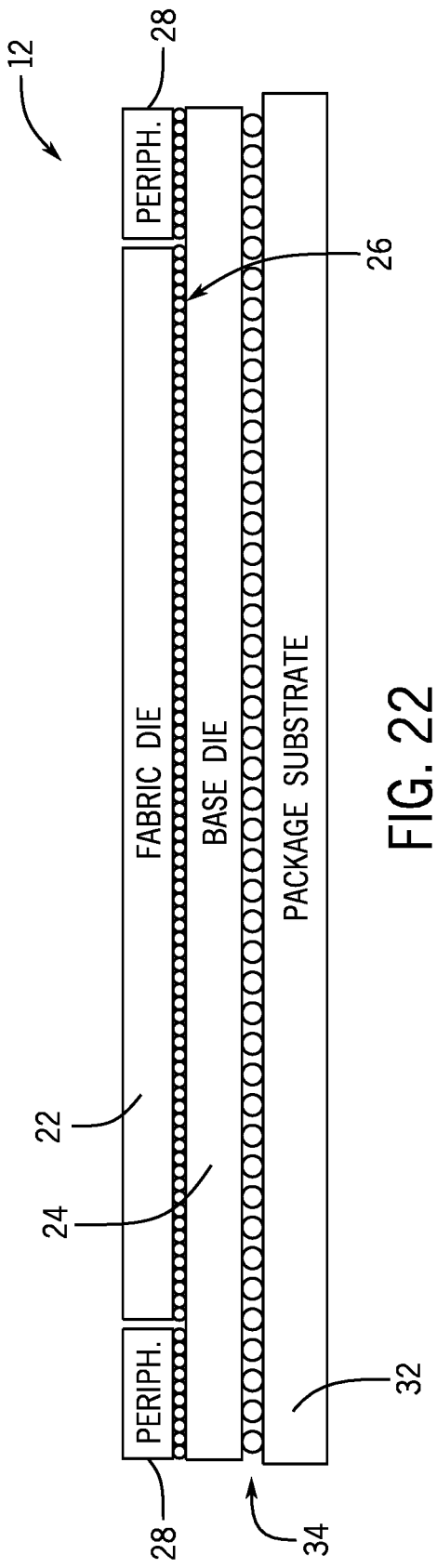
FIG. 22 is a block diagram of another package including the programmable logic device where the fabric die is stacked with the base die, in accordance with an embodiment.

The programmable logic device 12 may be packaged in a variety of configurations. In addition to the configuration shown in FIG. 2, the programmable logic device 12 may take the form shown in FIG. 22. In FIG. 22, the fabric die 22 is connected vertically to the base die 24 via microbumps 26. The peripheral circuitry 28 (e.g., the transceiver circuitry (HSSI) 44) may also be connected to the base die 24 via the microbumps 26. The base die 24 may attach to a package substrate 32 via C4 bumps 34.

Figure 23:
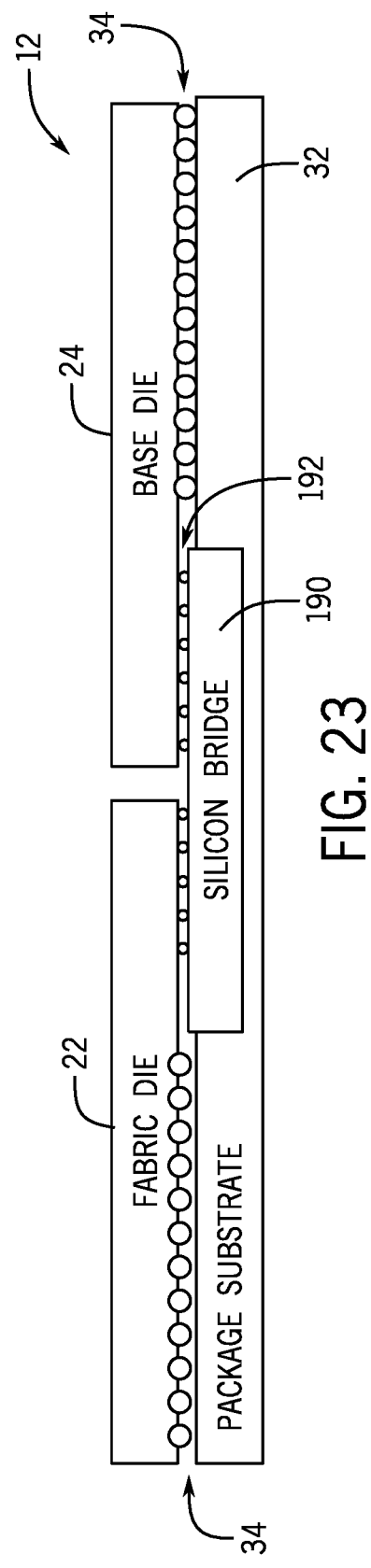
FIG. 23 is a block diagram of a package including the programmable logic device where the fabric die and the base die are connected via a silicon bridge, in accordance with an embodiment.
Figure 24:
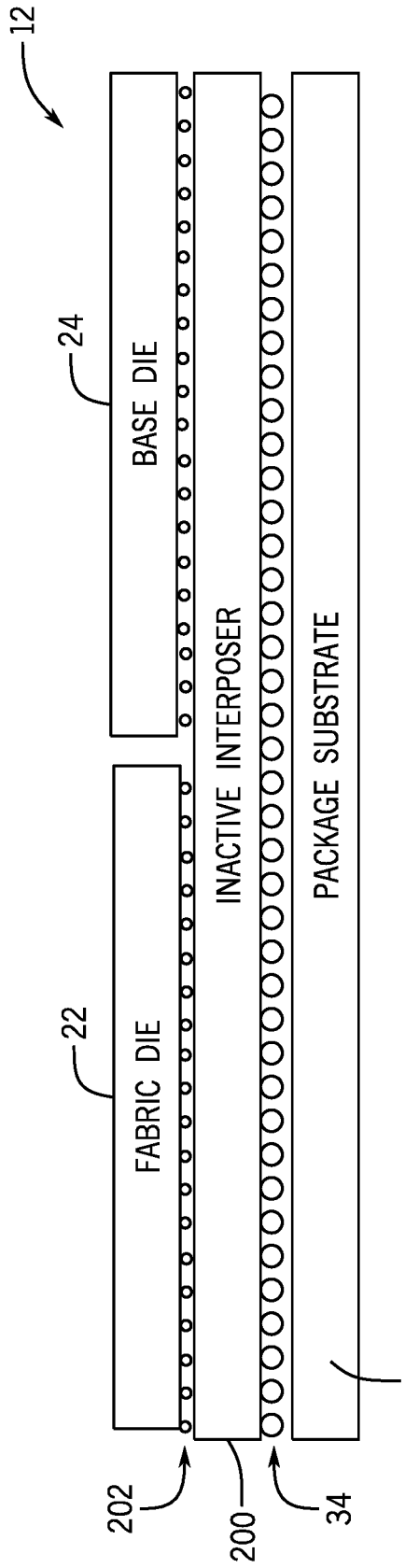
FIG. 24 is a block diagram of a package including the programmable logic device where the fabric die and the base die are connected via an inactive interposer, in accordance with an embodiment.

The programmable logic device 12 may also take a form in which the fabric die 22 and the base die 24 are not vertically stacked, but rather take a 2.5D packaging configuration. An example is shown in FIG. 23, where the fabric die 22 connects to the base die 24 via a silicon bridge 190 and microbumps 192. The fabric die 22 and the base die 24 may also connect to the package substrate 32 via C4 bumps 34. In another example, shown in FIG. 24, the fabric die 22 connects to the base die 24 via a silicon interposer 200 via microbumps 202.

Figure 25:
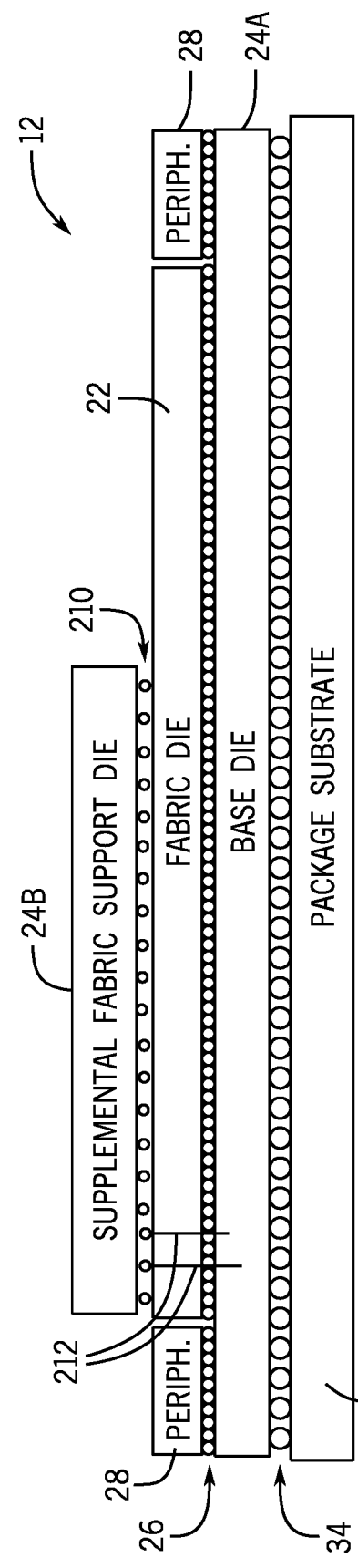
FIG. 25 is a block diagram of another package including the programmable logic device where the fabric die is stacked with two base die, in accordance with an embodiment.

There may also be more than one base die 24 for a respective fabric die 22. In an example shown in FIG. 25, the fabric die 22 may be connected vertically to a first base die 24A via microbumps 26. The peripheral circuitry 28 (e.g., the transceiver circuitry (HSSI) 44) may also be connected to the first base die 24A via the microbumps 26. The first base die 24A may attach to a package substrate 32 via C4 bumps 34. Additionally, a second base die 24B may connect to the first base die 24A via microbumps 210 and through-silicon vias (TSVs) 212 that pass through the fabric die 22. Additionally or alternatively, the second base die 24B may connect directly to the fabric die 22 via the microbumps 210.

Figure 26:
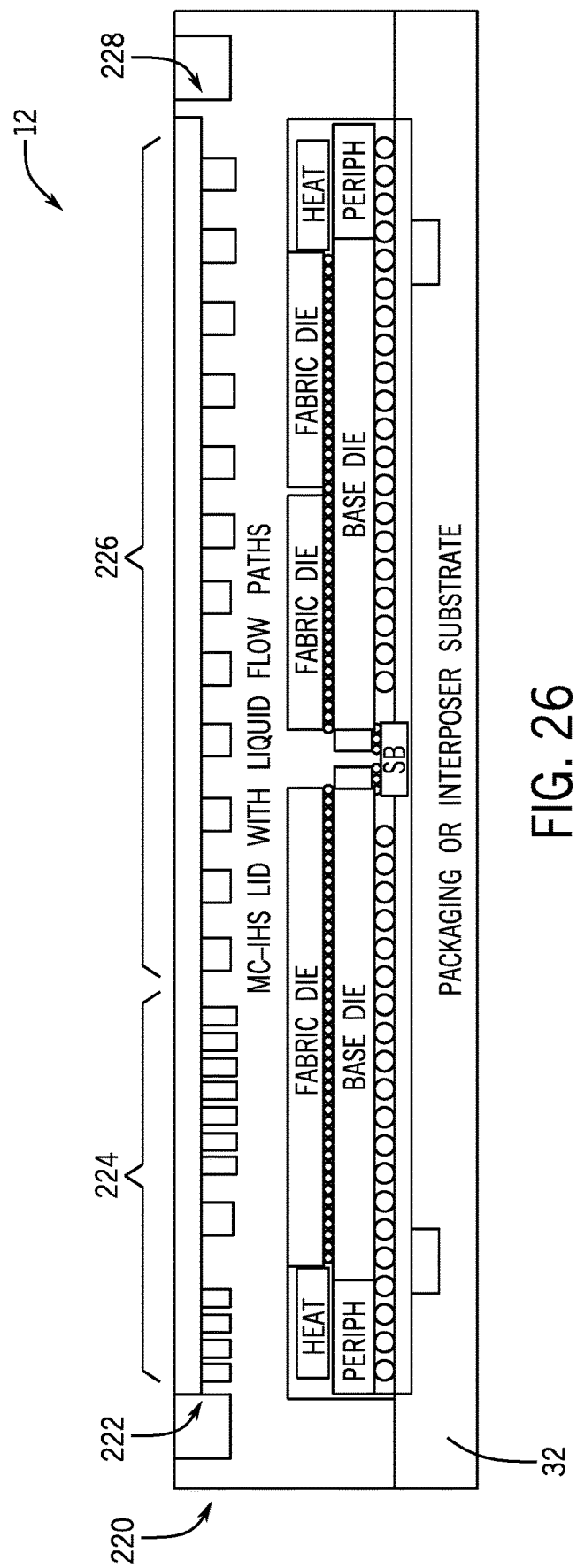
FIG. 26 is a block diagram of a package including the programmable logic device that includes a microchannel integrated heat spreader (MC-IHS), in accordance with an embodiment.

The packaging may also include a liquid cooling system, such as a microchannel integrated heat spreader (MC-IHS). Shown by way of example in FIG. 26, the programmable logic device 12 may include a microchannel integrated heat spreader (MC-IHS) 220. The MC-IHS 220 includes a liquid coolant inlet 222 and variably sized microchannels, such as dense microchannels 224 and sparse microchannels 226, which may correspondingly dissipate more or less heat, respectively. A liquid coolant may enter the liquid coolant inlet 222 and pass through the microchannels 224 and 226, drawing heat away from the programmable logic device 12, and may exit through a liquid coolant outlet 228 to be cooled by a heat transfer device (not shown). The MC-IHS 220 may be disposed around the programmable logic device 12 and, in some embodiments, may couple to the package substrate 32.

Figure 27:
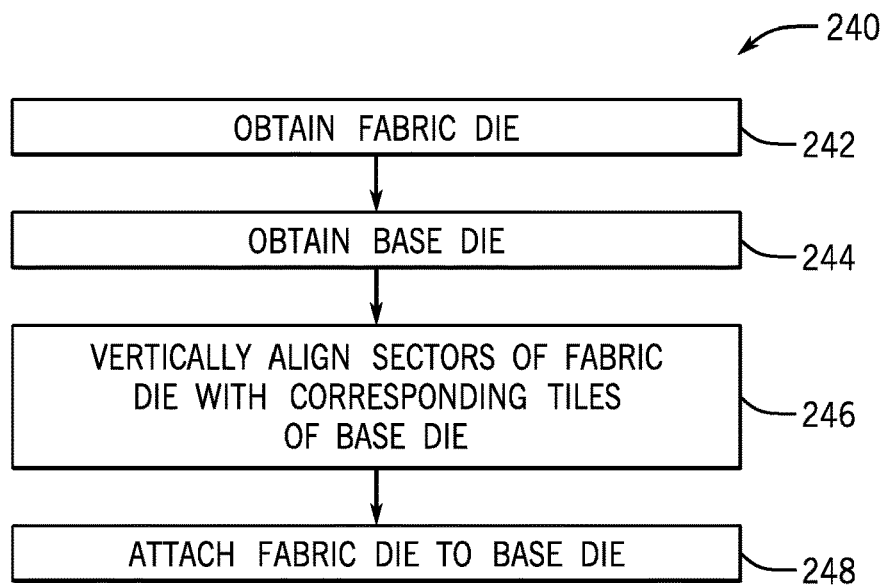
FIG. 27 is a flowchart of a method for manufacturing the programmable logic device, in accordance with an embodiment.

FIG. 27 is a flow chart 240 of one example of a method for manufacturing the programmable logic device 12. In the example of FIG. 27, a manufacturer may obtain the fabric die 22 (block 242) and the base die 24 (block 244). This may entail receiving the die from one or more other manufacturers, and/or may entail patterning the die using one or more lithographic processes. In one example, the fabric die 22 may be manufactured using a first generational process node (e.g., a higher-resolution, denser, more recent, and/or more expensive semiconductor device manufacturing technology), while the base die 24 may be manufactured using a second generational process node (e.g., a lower-resolution, less dense, older, and/or less expensive semiconductor device manufacturing technology). In another example, the fabric die 22 may be manufactured using a first generational process node (e.g., a lower-resolution, less dense, older, and/or less expensive semiconductor device manufacturing technology), while the base die 24 may be manufactured using a second generational process node (e.g., a higher-resolution, denser, more recent, and/or more expensive semiconductor device manufacturing technology). In another example, the fabric die 22 and the base die 24 may be manufactured using the same generational process node. The fabric die 22 and the base die 24 may vertically aligned so that fabric sectors of the fabric die 22 are aligned with sectors 90 of the base die 24 (block 246), and the fabric die 22 and the base die 24 may be attached in any suitable way (e.g., microbumps or silicon bridge) (block 248). The fabric die 22 base die 24 may be attached to a package substrate (e.g., before or after the two die have been attached together) and/or disposed into a microchannel integrated heat spreader (MC-IHS).

Figure 28:
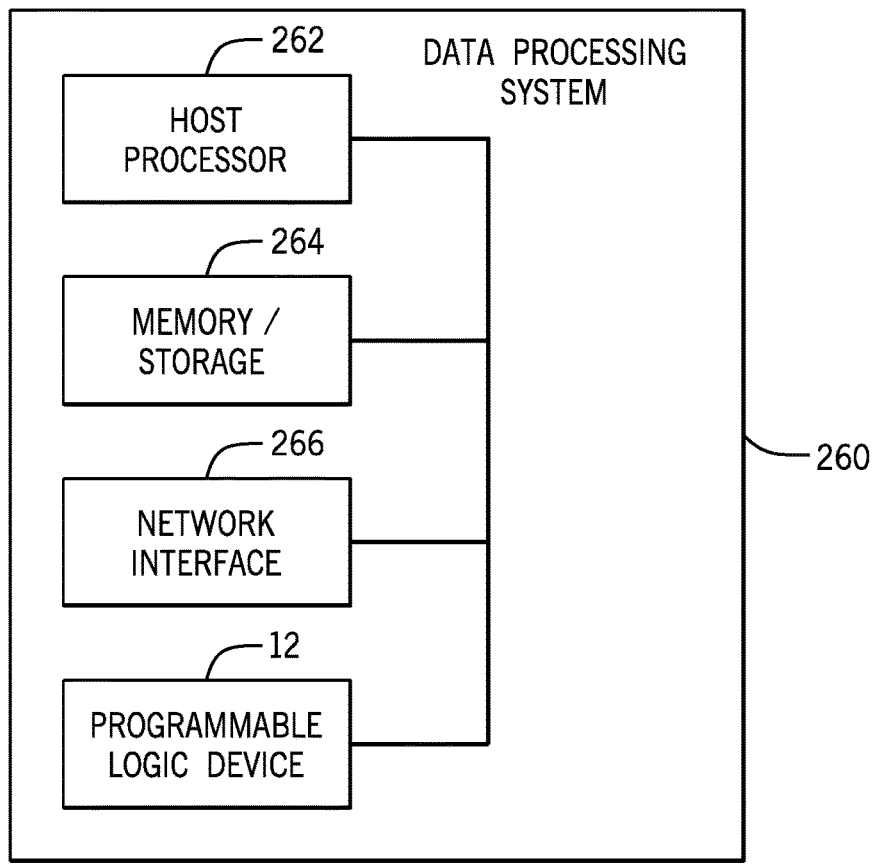
FIG. 28 is a block diagram of a data processing system that includes the programmable logic device, in accordance with an embodiment.

The programmable logic device 12 may be, or may be a component of, a data processing system. For example, the programmable logic device 12 may be a component of a data processing system 260, shown in FIG. 28. The data processing system 260 includes a host processor 262, memory and/or storage circuitry 264, and a network interface 266. The data processing system 260 may include more or fewer components (e.g., electronic display, user interface structures, application specific integrated circuits (ASICs)). The host processor 262 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 260 (e.g., to perform machine learning, video processing, voice recognition, image recognition, data compression, database search ranking, bioinformatics, network security pattern identification, spatial navigation, or the like). The memory and/or storage circuitry 264 may include random access memory (RAM), read-only memory (ROM), one or more hard drives, flash memory, or the like. The memory and/or storage circuitry 264 may hold data to be processed by the data processing system 260. In some cases, the memory and/or storage circuitry 264 may also store configuration programs (bitstreams) for programming the programmable logic device 12. The network interface 266 may allow the data processing system 260 to communicate with other electronic devices. The data processing system 260 may include several different packages or may be contained within a single package on a single package substrate.

In one example, the data processing system 260 may be part of a data center that processes a variety of different requests. For instance, the data processing system 260 may receive a data processing request via the network interface 266 to perform machine learning, video processing, voice recognition, image recognition, data compression, database search ranking, bioinformatics, network security pattern identification, spatial navigation, or some other specialized task. The host processor 262 may cause the programmable logic fabric of the programmable logic device 12 to be programmed with a particular accelerator related to requested task. For instance, the host processor 262 may instruct that a program (bitstream) stored on the memory/storage 264 or cached in sector-aligned memory of the programmable logic device 12 to be programmed into the programmable logic fabric of the programmable logic device 12. The program (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 260 in performing the requested task. Indeed, in one example, programming an accelerator to assist with a voice recognition task may take place faster than a few milliseconds (e.g., on the order of microseconds).

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples

What is claimed is:

1. An integrated circuit device comprising:
a first integrated circuit die comprising field programmable gate array fabric; and
a second integrated circuit die coupled to the first integrated circuit die, wherein the second integrated circuit die comprises fabric support circuitry configured to operate the field programmable gate array fabric of the first integrated circuit die, wherein the first integrated circuit die and the second integrated circuit die form a field programmable gate array (FPGA).

2. The integrated circuit device of claim 1, wherein the fabric support circuitry of the second integrated circuit die comprises a device controller configured to control circuitry of the first integrated circuit die and the second integrated circuit die, a sector controller configured to control a sector of circuitry of the first integrated circuit die and the second integrated circuit die, a network-on-chip, a configuration network on chip, data routing circuitry, sector-aligned memory, a memory controller configured to program the field programmable gate array fabric, an input/output (I/O) interface for the field programmable gate array fabric, an external memory interface, a first processor embedded in the second integrated circuit die, an interface to connect the field programmable gate array fabric to a second processor external to the first integrated circuit die and the second integrated circuit die, voltage control circuitry configured to control a voltage supplied to the field programmable gate array fabric, thermal monitoring circuitry configured to monitor heat of the first integrated circuit die, a decoupling capacitor, a power clamp, electrostatic discharge circuitry, or any combination thereof.

3. The integrated circuit device of claim 1, wherein the second integrated circuit die comprises an active interposer.

4. The integrated circuit device of claim 1, wherein the first integrated circuit die and the second integrated circuit die are vertically stacked.

5. The integrated circuit device of claim 4, wherein a plurality of first sectors of the field programmable gate array fabric of the first integrated circuit die are vertically aligned with a corresponding plurality of second sectors of the fabric support circuitry of the second integrated circuit die.

6. The integrated circuit device of claim 4, wherein the first integrated circuit die comprises a first sector occupying a first area of the first integrated circuit die, wherein the second integrated circuit die comprises a second sector occupying a second area of the second integrated circuit die, wherein the first area has a different size than the second area.

7. The integrated circuit device of claim 4, comprising a third integrated circuit die comprising additional circuitry configured to operate the field programmable gate array fabric of the first integrated circuit die, wherein the first integrated circuit die, the second integrated circuit die, and the third integrated circuit die are vertically stacked.

8. The integrated circuit device of claim 7, wherein the third integrated circuit die is stacked above the first integrated circuit die, and wherein the first integrated circuit die is stacked above the second integrated circuit die.

9. The integrated circuit device of claim 8, wherein the third integrated circuit die is communicatively connected to the second integrated circuit die by way of a through-silicon via (TSV) through the first integrated circuit die.

10. The integrated circuit device of claim 1, comprising a passive interposer or silicon bridge configured to facilitate communication between the first integrated circuit die and the second integrated circuit die.

11. The integrated circuit device of claim 10, wherein the first integrated circuit die and the second integrated circuit die are disposed on a same side of the passive interposer or the silicon bridge.

12. The integrated circuit device of claim 1, comprising a package substrate, wherein the second integrated circuit die is connected to the package substrate with first bumps of a first size, and wherein the second integrated circuit die is connected to the first integrated circuit die with second bumps of a second size, wherein the second size is smaller than the first size.

13. The integrated circuit device of claim 1, comprising a third integrated circuit die comprising second fabric support circuitry configured to operate the field programmable gate array fabric of the first integrated circuit die.

14. The integrated circuit device of claim 1, wherein the fabric support circuitry is configured to operate the field programmable gate array fabric according to a configuration program corresponding to a programmable circuit design of the field programmable gate array fabric.

15. An integrated circuit device comprising:
a first integrated circuit die comprising field programmable gate array fabric divided into a first plurality of sectors, wherein circuitry of the first integrated circuit die consists essentially of digital circuitry; and
a second integrated circuit die coupled to the first integrated circuit die, wherein the second integrated circuit die comprises digital and analog circuitry divided into a second plurality of sectors and configured to operate the field programmable gate array fabric, wherein the first integrated circuit die and the second integrated circuit die are vertically stacked such that the first plurality of sectors are vertically aligned with corresponding sectors of the second plurality of sectors.

16. The integrated circuit device of claim 15, wherein the first integrated circuit die and the second integrated circuit die form a field programmable gate array (FPGA).

17. The integrated circuit device of claim 15, wherein the second integrated circuit die comprises phase locked loop circuitry.

18. The integrated circuit device of claim 15, wherein the digital and analog circuitry of the second integrated circuit die is configured to enable operation of the field programmable gate array fabric.

19. The integrated circuit device of claim 15, wherein the first integrated circuit die and the second integrated circuit die are vertically stacked.

20. A device comprising:
a field programmable gate array comprising:
a first integrated circuit die comprising field programmable gate array fabric; and
a second integrated circuit die coupled to the first integrated circuit die, wherein the second integrated circuit die comprises fabric support circuitry configured to:

receive a configuration program corresponding to a programmable circuit design of the field programmable gate array fabric; and operate the field programmable gate array fabric of the first integrated circuit die based on the configuration program.

21. The device of claim 20, wherein the configuration program comprises a bitstring.

22. The device of claim 20, wherein the first integrated circuit die is directly coupled to the second integrated circuit die.

23. The device of claim 22, wherein the first integrated circuit die is directly coupled to the second integrated circuit die via a plurality of microbumps.

24. The device of claim 22, wherein the first integrated circuit die is directly coupled to the second integrated circuit die such that a first plurality of sectors of the first integrated circuit die are aligned with respective sectors of a second plurality of sectors of the second integrated circuit die.

* * * * *